US009236849B2

(12) United States Patent
Abbott et al.

(10) Patent No.: US 9,236,849 B2
(45) Date of Patent: Jan. 12, 2016

(54) HIGH COUPLING, LOW LOSS PBAW DEVICE AND ASSOCIATED METHOD

(71) Applicant: TriQuint Semiconductor, Inc., Hillsboro, OR (US)

(72) Inventors: Benjamin P. Abbott, Maitland, FL (US); Natalya F. Naumenko, Moscow (RU); Marc Solal, Longwood, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 297 days.

(21) Appl. No.: 13/801,145

(22) Filed: Mar. 13, 2013

(65) Prior Publication Data

US 2013/0342286 A1    Dec. 26, 2013

Related U.S. Application Data

(60) Provisional application No. 61/635,821, filed on Apr. 19, 2012.

(51) Int. Cl.
 *H03H 9/02*   (2006.01)
 *H03H 9/145*  (2006.01)
(52) U.S. Cl.
 CPC ......... *H03H 9/02866* (2013.01); *H03H 9/0222* (2013.01); *H03H 9/14538* (2013.01)
(58) Field of Classification Search
 CPC ............ H03H 9/0222; H03H 9/02228; H03H 9/02866
 USPC .................................................. 333/193–196
 See application file for complete search history.

(56) References Cited

U.S. PATENT DOCUMENTS

| | | | |
|---|---|---|---|
| 5,313,177 A | 5/1994 | Hickernell et al. | |
| 5,389,806 A | 2/1995 | Hickernell et al. | |
| 5,682,126 A | 10/1997 | Plesski et al. | |
| 7,339,304 B2 | 3/2008 | Kadota | |
| 7,345,400 B2 | 3/2008 | Nakao | |
| 7,355,319 B2 | 4/2008 | Kando | |
| 7,411,334 B2 | 8/2008 | Nishiyama | |
| 7,471,171 B2 | 12/2008 | Miura et al. | |
| 7,915,786 B2 * | 3/2011 | Matsuda et al. | 310/313 A |
| 8,421,560 B2 * | 4/2013 | Yamamoto et al. | 333/195 |
| 8,552,819 B2 | 10/2013 | Abbott et al. | |
| 8,710,713 B2 * | 4/2014 | Kando | 310/313 B |
| 2007/0284965 A1 | 12/2007 | Kadota | |

(Continued)

OTHER PUBLICATIONS

Naumenko, et at,; "Analysis of Highly Piezoelectric Non-Leaky SAW Propagating in Rotated Y-Cuts of Lithium Niobate with Thick Metal Films or Gratings," Proc. 2006, IEEE Ultrasonics Symposium, Vancouver, B.C., Canada; Oct. 4-6, 2006.

(Continued)

*Primary Examiner* — Dean Takaoka
*Assistant Examiner* — Alan Wong
(74) *Attorney, Agent, or Firm* — Withrow & Terranova, P.L.L.C.

(57) ABSTRACT

In embodiments, a piezoelectric acoustic wave (PBAW) device may include a substrate and a resonator comprising a plurality of electrodes coupled with the surface of the substrate. A dielectric overcoat may be disposed over the substrate and the resonator. In embodiments, and electrode in the resonator electrode may have a width that is based at least in part on a period of the resonator. By selecting the width of the electrode based at least in part on the period of the resonator, a spurious-mode of the passband of the PBAW device may be suppressed.

21 Claims, 32 Drawing Sheets

(56) References Cited

U.S. PATENT DOCUMENTS

2008/0160178 A1  7/2008  Nishiyama
2010/0231330 A1* 9/2010  Ruile et al. .................. 333/193

OTHER PUBLICATIONS

Omori, et al.;"Low-Loss and Extremely-Wideband SAW Filters on a Cu-Grating/Rotated-YX-LiNbO3 Structure," Third International Symposium on Acoustic Wave Devices for Future Mobile Communication Systems, pp. 157-162; 2007.

Kadota, et al.; "Small SAW Duplexer for W-CDMA Full-Band with Good Temperature Characteristics," Third International Symposium on Acoustic Wave Devices for Future Mobile Communication Systems, pp. 145-150; 2007.

Takayama, et al; "Advancement of SAW Duplexer by using SI02," Third International Symposium on Acoustic Wave Devices for Future Mobile Communication Systems, pp. 139-144; 2007.

Nakamura, et al.; "Small-sized SAW Duplexer on Non-flat Si02/Al/LiNb03 Structure for UMTS Band I System," Microwave Symposium Digest (MTT), 2010 IEEE MTT-S International, pp. 1464-1467; 2010.

Kadota, M. et al., "SAW Duplexer for PCS in US with Excellent Temperature Stability," 2003 IEEE Ultrasonics Symposium, Oct. 5-8, 2003, IEEE, 5 pages.

Kadota, M. et al., "SAW Substrate with Coupling Factor and Excellent Temperature Stability suitable for Duplexer of PCS in US," 2004 IEEE International Ultrasonics, Ferroelectrics, and Frequency Control Joint 50th Anniversary Conference, Aug. 23-27, 2004, IEEE, pp. 1970-1975.

Nakamura, H. et al., "Suppression of Transverse-Mode Spurious Responses by selectively $SiO_2$ removing technique for SAW Resonators on a $SiO_2/Al/LinbO_3$ Structure," 2010 IEEE International Ultrasonics Symposium Proceedings, Oct. 11-14, 2010, IEEE, pp. 629-632.

* cited by examiner

HIGH COUPLING, LOW LOSS PBAW DEVICE AND ASSOCIATED METHOD

CROSS REFERENCE TO RELATED APPLICATIONS

The present application claims priority to U.S. Provisional Patent Application No. 61/635,821, filed Apr. 19, 2012, entitled "Boundary Acoustic Wave Techniques and Configurations," the entire disclosure of which is hereby incorporated by reference in its entirety.

FIELD

Embodiments relate to piezoelectric boundary acoustic wave (PBAW) devices, also called PBAW filters, and more particularly to PBAW devices having a strong electromechanical coupling, low spurious responses, and a desired frequency-temperature characteristic for application in radio frequency (RF) filtering for wireless communications.

BACKGROUND

PBAW devices are successfully used in wireless communication systems as a result of their small size and low insertion loss provided by resonator-type structures, built on piezoelectric substrates with high electromechanical coupling factors.

It may be generally desirable for the PBAW device to have a smooth frequency response over a relatively large range of frequencies. However, in some cases, a PBAW device may have "spurious" modes where the frequency response of the PBAW device becomes distorted. In these cases, the PBAW device may have a relatively increased or decreased frequency response for a relatively narrow frequency band. These PBAW devices may be difficult to use, because the spurious modes may produce unpredictable results, or significant deviations, over relatively narrow frequency ranges.

BRIEF DESCRIPTION OF THE DRAWINGS

Features and advantages of the present disclosure will become apparent from the following detailed description of embodiments herein disclosed by way of example with reference to the attached drawings.

DETAILED DESCRIPTION

Figure 1:
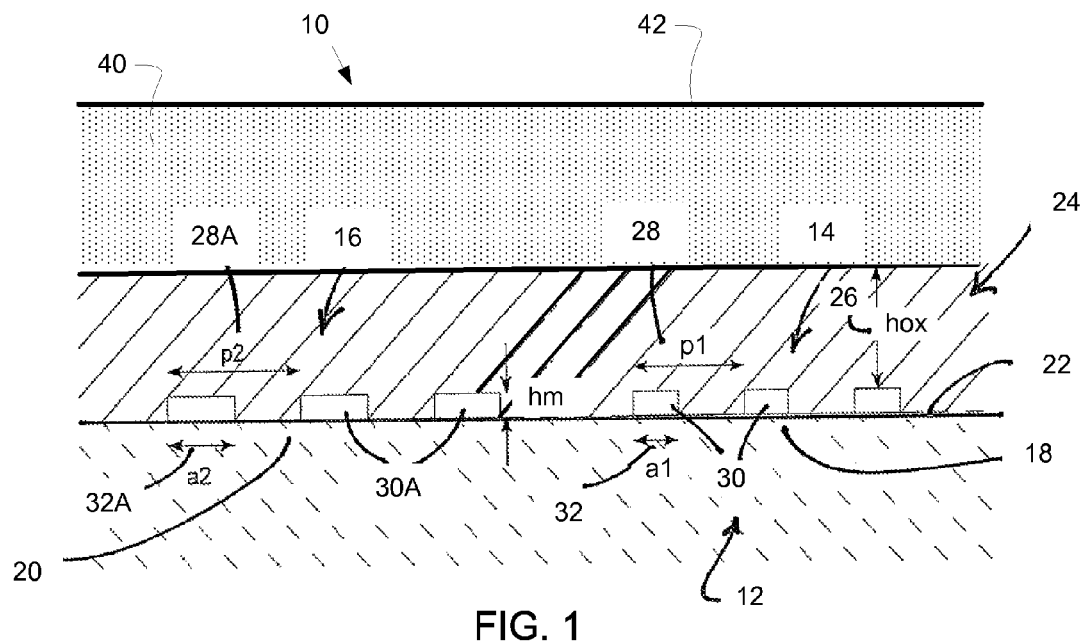
FIG. 1 is a cross sectional view of an example PBAW device, in accordance with various embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. Moreover, it should also be understood that any temperature, weight, volume, time interval, range, other measurements, quantities and numerical expressions given herein are intended to be approximate and not exact or critical values unless expressly stated to the contrary. Where appropriate, it may be proper to describe various embodiments using approximate or relative terms and terms of degree commonly used, such as dimensioned, about, approximately, substantially, essentially, comprising, and the like.

In some embodiments, as described in greater detail below with respect to FIG. 3, a PBAW device may act as a filter having a specific passband. That is, the PBAW device may act to pass signals in a specific frequency band. However, in some cases a spurious-mode may be introduced to the passband which undesirably affects the performance of the PBAW device, as described above. The spurious mode may be the result of factors such as bulk acoustic wave (BAW) radiation in the passband.

Specifically, in some PBAW devices, it may be difficult to maintain a large coupling coefficient with a broad filter bandwidth that is substantially free of spurious mode effects. For example, some PBAW devices may reduce the spurious-mode by rotating the resonators such that the acoustic wave's propagation deviates from the x-direction. However, this rotation may result in a reduction of the coupling coefficients of the PBAW device. In other PBAW devices, variation in the periods of electrodes in a resonator may make it difficult to remain substantially free of spurious mode effects for each resonator in the PBAW device.

Some existing PBAW devices may have advantageous shear horizontal (SH) type boundary acoustic waves that make the PBAW devices desirable for use in cellular phone applications. In general, the PBAW devices may be composed of electrodes having a low shear wave velocity which are disposed between two materials, for example the substrate and the dielectric overcoat described below with respect to FIG. 1. In some PBAW devices, the electromechanical coupling factor $K^2$, which is described in further detail below, may be between 0 and 16%. These PBAW devices may have a normalized bandwidth of 0.67 to 1.85 times as large as that of a leaky surface acoustic wave (LSAW) filter which in some cases may be comprised of a y-rotated, x-propagating Lithium Tantalate ($LiTaO_3$) substrate with a y-rotation of between 36° and 46°. An LSAW filter having an $LiTaO_3$) may also be referred to as an LT-LSAW filter. Additionally, some PBAW devices may have a temperature coefficient of frequency (TCF) between 0 and approximately −25 ppm/° C.

However, several of the PBAW devices described above may suffer from the existence of modes of various polarizations which may be guided at the substrate's surface or at the interfaces between the layers of the substrate. These various acoustic modes may be present in the PBAW device's passband and introduce spurious distortions, as described above. The configurations of PBAW devices described above may not currently allow filters to be constructed with a spurious-free passband. One reason why existing PBAW devices are so limited is because when the electrode and overcoat thicknesses are fixed, as they may generally be, and the electrode periods vary more than a few percent, a spurious response may manifest in at least some of the resonators.

Embodiments of the present disclosure may be more desirably configured to reduce or eliminate the spurious response in a PBAW device. In embodiments, spurious-modes of a PBAW device may be suppressed by modulating the duty factor of electrodes in a resonator on the PBAW device based on the period of the electrodes in the resonator. Specifically, resonators with electrodes with larger periods may have larger duty factors, while resonators with electrodes with smaller periods may have smaller duty factors. By controlling the spurious modes in this method, a resulting PBAW device may include benefits such as an implicit hermetic package, a size on the order of the size of a bare die, a low temperature drift, a relatively large coupling coefficient on the order of $K^2$ approximately equal to 16% as described in further detail below, and a wide and spurious free passband, amongst other benefits.

With reference initially to FIG. 1, a PBAW device 10 may comprise a substrate 12, e.g., a single crystal piezoelectric substrate, for providing a propagation of an acoustic wave. In embodiments, first and second resonators 14, 16 may be formed by first and second electrode patterns 18, 20 on a surface 22 of the substrate 12. The PBAW device 10 may include a dielectric overcoat 24, with a positive temperature coefficient of frequency (TCF). In embodiments, the dielectric overcoat 24 may have a thickness $h_{ox}$ 26, and be comprised of silicon oxide ($SiO_2$). In other embodiments, the dielectric overcoat 24 may be some other dielectric material. In embodiments such as PBAW device 10 shown in FIG. 1, the first and second resonators 14 and 16 may share an acoustic path. However, in other embodiments of a PBAW device with more than one resonator, the resonators may not share an acoustic path.

In embodiments, the dielectric overcoat 24 may be between and over the electrodes 30 and 30a of the resonators 14 and 16. Resonator 14 may have an electrode period 28 (also referred to as p1), which may indicate the width 32 (also referred to as a1) of an electrode 30 in addition to the spacing between adjacent electrodes 30. Resonator 16 may share the dielectric overcoat 24 with the first resonator 18, and have an electrode period 28A (also referred to as p2), and electrodes 30A having an electrode width 32A (also referred to as a2). In embodiments, electrodes such as electrodes 30 may have an electrode height $h_m$.

In embodiments, copper (Cu), gold (Au), and tungsten (W) electrodes may be described herein, which may be similar to electrodes 30 or 30A. When an aspect of a specific electrode is described, then that material may be denoted with one of the designators above. When an aspect of a general electrode is described, then that material may be denoted with the label "m." For example, $h_m$ may be a height of a general electrode, while $h_{cu}$ may refer to the height of the copper electrode. An example of $h_m$ may be seen with respect to FIG. 1 while discussing the height of the general electrodes 30 and 30a. Similarly, the designator "ox" may be used to refer to the dielectric overcoat 24. As an example, $h_{ox}$ may be seen in FIG. 1.

In other embodiments, the PBAW device 10 may only include a single resonator, e.g. resonator 14 or resonator 16. Or embodiments may include more than two resonators, each with associated electrode periods and widths, as described in further detail below with respect to FIG. 49. In embodiments, the PBAW device 10 may further include an additional material 40 overlaying the dielectric overcoat 24. In embodiments, the additional material 40 may be composed of silicon nitride ($Si_3N_4$), aluminum nitride (AlN), and/or some other material. In embodiments, the additional material 40 may be specifically chosen to have a shear wave velocity greater than that of the dielectric overcoat 24. By having a greater shear wave velocity through the additional material 40, acoustic motion on a top surface 42 of the additional material 40 may be suppressed. In embodiments, the additional material 40 may be flat, as depicted in FIG. 1, while in other embodiments the additional material 40 may be some other shape such as rounded.

Figure 48:
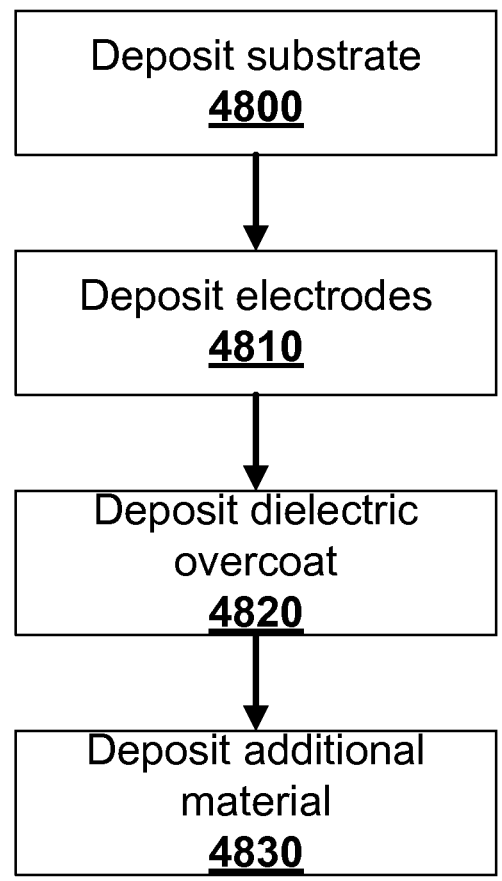
FIG. 48 is an example process for constructing a PBAW device, in accordance with various embodiments.

FIG. 48 depicts an example process for constructing a PBAW device such as PBAW device 10. Initially, a substrate such as substrate 12 may be deposited at 4800. Next, one or more electrodes such as electrodes 30 or 30A may be deposited on a surface 22 of the substrate 12 at 4810. After depositing the electrodes, a dielectric overcoat such as dielectric overcoat 24 may be deposited substantially over the electrodes 30 and 30A and the substrate 12 at 4820. Finally, the additional material 40 may be deposited overtop the dielectric overcoat at 4830. One or more of the deposition steps may be performed by any means or method including, but not limited to, lamination, spraying, etching, etc. and may include the use of one or more of a photoresist layer, a solder-resist layer, or some other layer.

In various embodiments, the relationship between the electrode periods 28 and 28A and electrode widths 32 and 32A may be specifically configured to facilitate efficient operation of the PBAW device 10. Efficient operation may include, for example, exhibition of a strong electromechanical coupling factor, reduced temperature coefficient of frequency (TCF), and/or robust suppression of spurious modes. In some embodiments, the relationship of the electrode width 32 to electrode period 28 may be such that each electrode period 28, e.g., p1, is associated with a respective ratio of electrode width-to-period, e.g., a1/p1. A ratio of electrode width-to-period may also be referred to as a "duty factor." Thus, for example, an embodiment may have electrodes arranged with a plurality of different electrode periods with each of the plurality of different electrode periods being associated with a respective ratio of electrode width-to-period. The embodiment shown in FIG. 1 generally portrays two resonators 14 and 16 with the electrodes 30 and 30A within each resonator 14 and 16 having a common electrode period 28 or 28A and width 32 or 32A. However, other embodiments may have other numbers of resonators, with one or more of the resonators having one or more different electrode periods and/or electrode widths.

Figure 2:
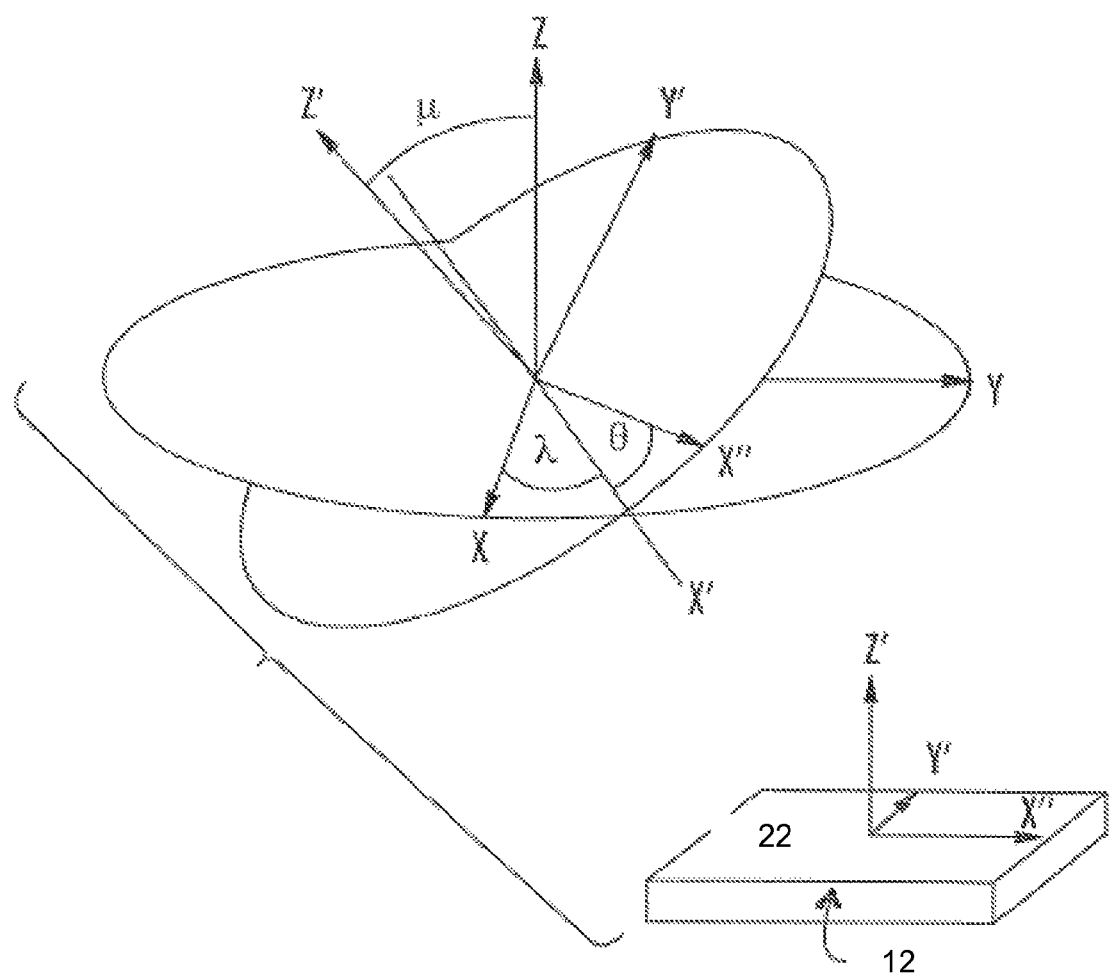
FIG. 2 diagrammatically illustrates Euler angles ($\lambda$, $\mu$, $\theta$), in accordance with various embodiments.

In some embodiments, the substrate 12 may be y-rotated, as described in further detail below. FIG. 2 depicts an example of Euler angles that may provide reference for the y-rotation. In these embodiments, the shear wave may propagate in the x-direction. The substrate 12 may in some embodiments be referred to as a y-rotated, x-propagating lithium niobate (YX-LN) substrate, though as noted above in other embodiments the substrate 12 may be some other element, material, or compound.

Figure 3:
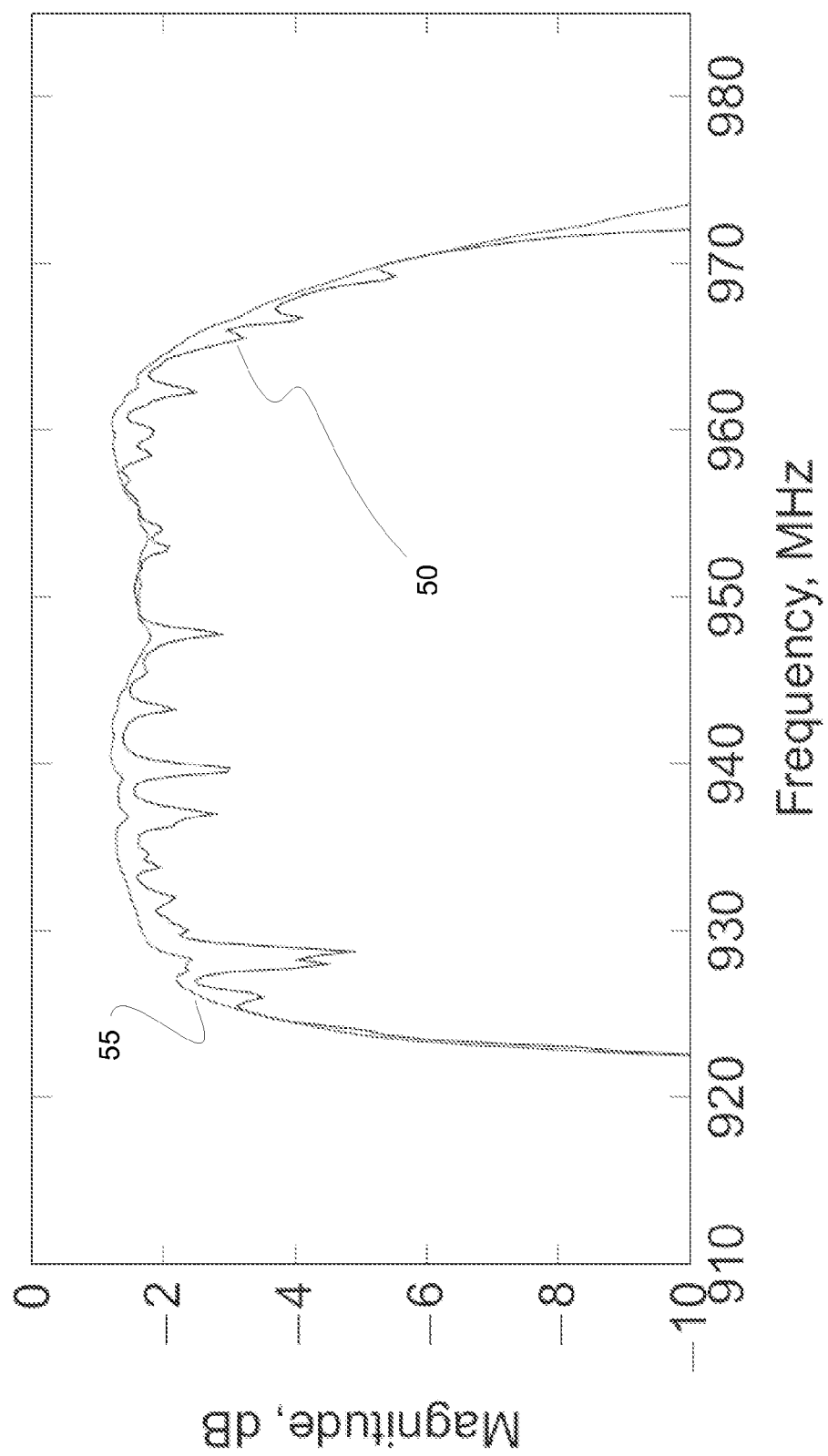
FIG. 3 is a graphic showing an example of the electrical responses within a PBAW device's passband with and without spurious modes, in accordance with various embodiments.

As described above, in some embodiments a PBAW device 10 may suffer from the presence of a spurious mode in the bandpass response, for example as can be seen in FIG. 3. In embodiments, a spurious mode may occur if electrode thickness $h_m$ and dielectric overcoat thickness $h_{ox}$ are fixed, but electrode periods vary between resonators of the PBAW device 10. Line 50 depicts the presence of a sawtooth pattern in the bandpass filter as a response of a spurious mode in the PBAW device 10. The spurious modes may significantly decrease the signal response of the PBAW device 10 at certain frequencies, for example around 928 MHz in FIG. 3. By contrast, line 55 depicts a more desirable response of the PBAW device 10 where spurious modes are suppressed. It may be seen that the filter response is much smoother and more predictable when spurious modes are suppressed. In embodiments, some degree of suppression, such as that indicated by line 55, may be achieved by appropriate selection and combination of electrode thickness and dielectric overcoat thickness, as further described herein.

Figure 49:
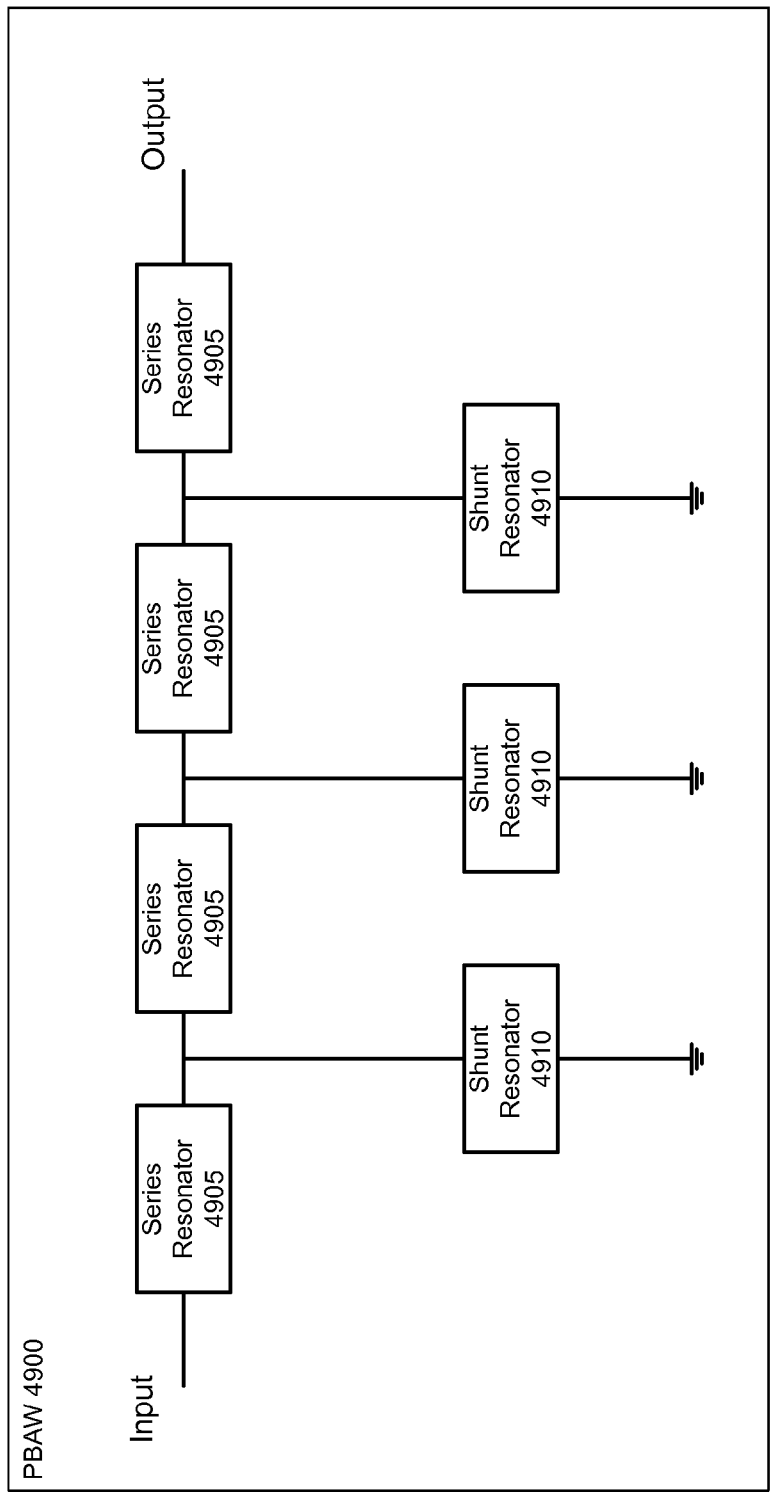
FIG. 49 is an example PBAW device, in accordance with various embodiments.

FIG. 49 depicts a high level example of a PBAW 4900 such as PBAW 10. In embodiments, the PBAW 4900 may have several resonators such as series resonators 4905, which may be similar to resonators 14 or 16, or shunt resonators 4910, which may also be similar to resonators 14 or 16. In general, each of the series resonators 4905 may have similar electrode periods and/or frequency features. Similarly, each of the shunt resonators 4910 may have similar electrode periods and/or frequency features. Although a certain number and configuration of series resonators 4905 and shunt resonators 4910 are shown here for PBAW 4900, other embodiments may have different numbers or configurations of series and shunt resonators 4905 and 4910.

In embodiments, each of the resonators may have resonance frequencies, $f_R$, and anti-resonance frequencies, $f_A$. In embodiments, the shunt resonators 4910 may all have similar resonance and anti-resonance frequencies to one another, and the series resonators 4905 may all have similar resonance and anti-resonance frequencies to one another. In embodiments, the difference between $f_R$ and $f_A$ of the series resonators may be approximately equal to the difference between $f_R$ and $f_A$ of the shunt resonators. In some embodiments, $f_A$ of the shunt resonators may be approximately equal to $f_R$ of the series resonators.

Figure 4:
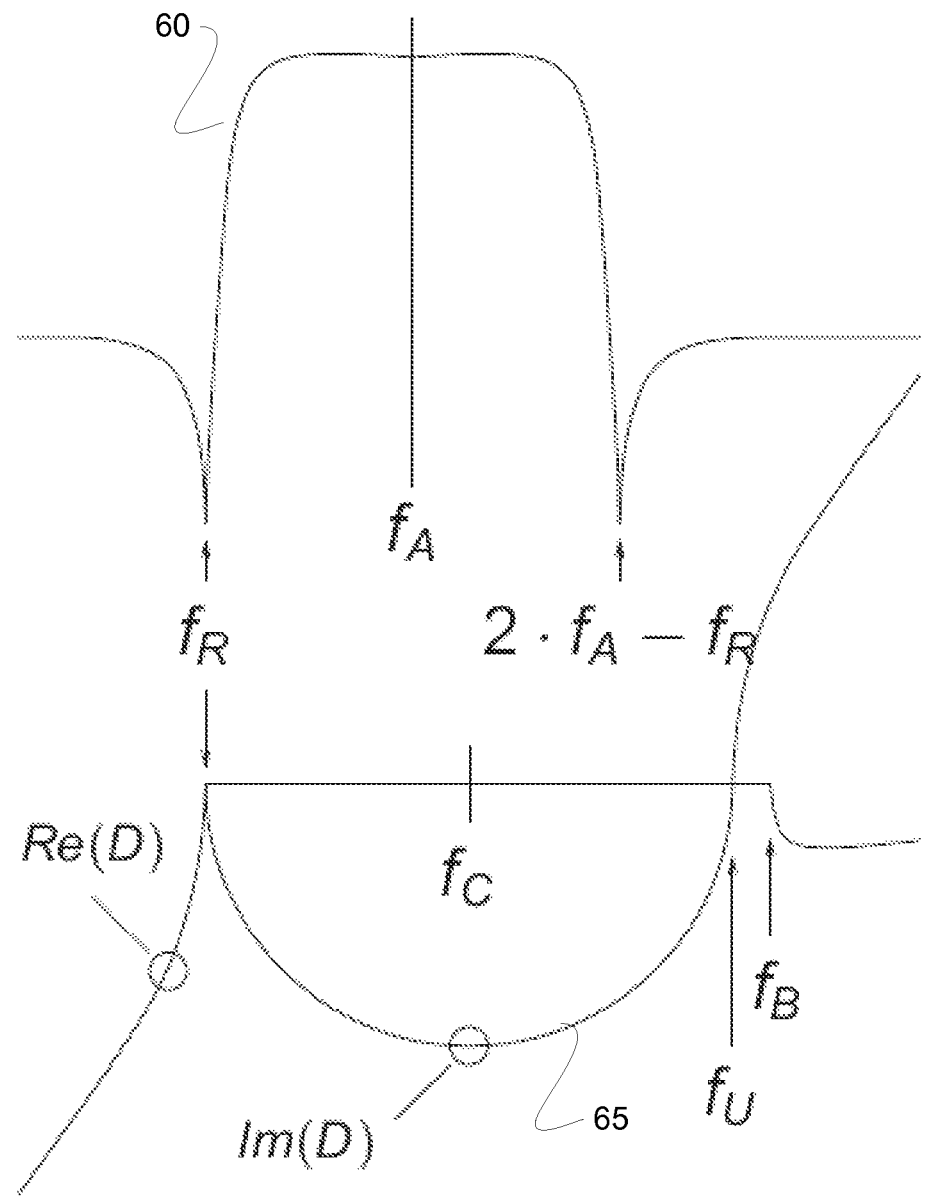
FIG. 4 displays a PBAW device's passband and stopband, and their relationship to the Brillion diagram of one of the filter's shunt resonators, in accordance with various embodiments.

FIG. 4 depicts an example of a spurious mode free passband 60 of the PBAW device 10 with an upper skirt $(2*f_A-f_R)$ and a lower skirt $f_R$. In FIG. 4, $f_A$ and $f_R$, as depicted, may correspond to the anti-resonant frequency and resonant frequencies of one or more shunt resonators, for example shunt resonators 4910. In some embodiments, the upper skirt, denoted here as $(2*f_A-f_R)$ of the shunt resonators, may also be denoted as $f_A$ for the series resonators of the PBAW device 10, for example series resonators 4905.

FIG. 4 also depicts an example Brillouin zone for the shunt resonator 4910 forming the filter's lower skirt. The Brillouin zone's wavenumber is represented by D. In FIG. 4, an example Brillouin zone stopband 65 of the PBAW device 10, is shown. The stopband 65 is labeled as Im(D) and lies between lower stopband edge, $f_R$, and the upper stopband edge, $f_U$. In FIG. 4, slightly above the stopband 65 is shown a cut-off frequency, $f_B$, which may be formed by scattering of the PBAW into a BAW which propagates downward into the substrate.

In embodiments, it may be desirable for the upper skirt $(2*f_A-f_R)$ of the passband 60 to be less than the PBAW device cut-off $f_B$ and the upper stopband edge $f_U$. For example, by setting the upper skirt $(2*f_A-f_R)$ less than the PBAW device cut-off $f_B$ and the upper stopband edge $f_U$, excessive loss and/or passband distortion of the PBAW device 10 may be prevented or reduced. Generally, if the upper skirt $(2*f_A-f_R)$ of the passband 60 is greater than either the PBAW device cut-off $f_B$ and/or the upper stopband edge $f_U$, then a spurious mode may be introduced to the PBAW device 10.

In some embodiments, it may also be desirable to set the stopband center $f_C$ of the shunt resonators, forming the lower skirt, to be greater than the anti-resonance frequency, $f_A$, of these same shunt resonators, in order to longitudinally confine the acoustic energy within the resonator such as resonator 14 or 16, and to prevent spurious modes associated with the stopband's upper edge from appearing in the PBAW device's 10 passband. In embodiments, $f_R$, $f_A$, $f_U$, and $f_B$ may be selected based on one or more of the y-rotation of the substrate 12 and the duty factor of the electrodes 30 and 30A in the resonators 14 and 16. In embodiments, the cut-off margin $\Delta f_C$ may be defined as $\Delta f_C = f_B - (2*f_A - f_R)$, or the difference between the cutoff frequency, $f_B$, and the upper passband skirt $(2*f_A - f_R)$.

The present embodiments are herein illustrated applying an analysis using finite element method/boundary element method (FEM/BEM) or finite element method/spectral domain analysis (FEM/SDA) to calculate the behavior of the desired and spurious modes on YX-LN substrates. In particular, the dependence of each mode's coupling and velocity may be estimated using one or more of the FEM/BEM and/or FEM/SDA methods.

In the following figures, contours are depicted as described. In general, and unless otherwise noted, the contours may be interpreted as the results of a function of the variables on at least the y-axis and the x-axis of the figures. In at least some of the figures, a dashed and dotted line (- • - • - •) is used to represent points on the figure where the cut-off margin may approximate or be equal to 0. Additionally, in at least some of the figures, a dashed line (- - - - -) is used to represent points where the spurious mode may equal to or approximately equal to 0.

Electrode Material

In embodiments, a PBAW device 10 may achieve at least some of the desirable properties of the passband 60 described above with respect to FIG. 4, and subsequent elimination or reduction of spurious modes, through selection of the material for the electrodes 30 and 30A. Specifically, if one or more of the electrode height $h_m$ or period p of electrodes in the resonator are set, then the material that the electrode is constructed of may be varied.

Figure 5:
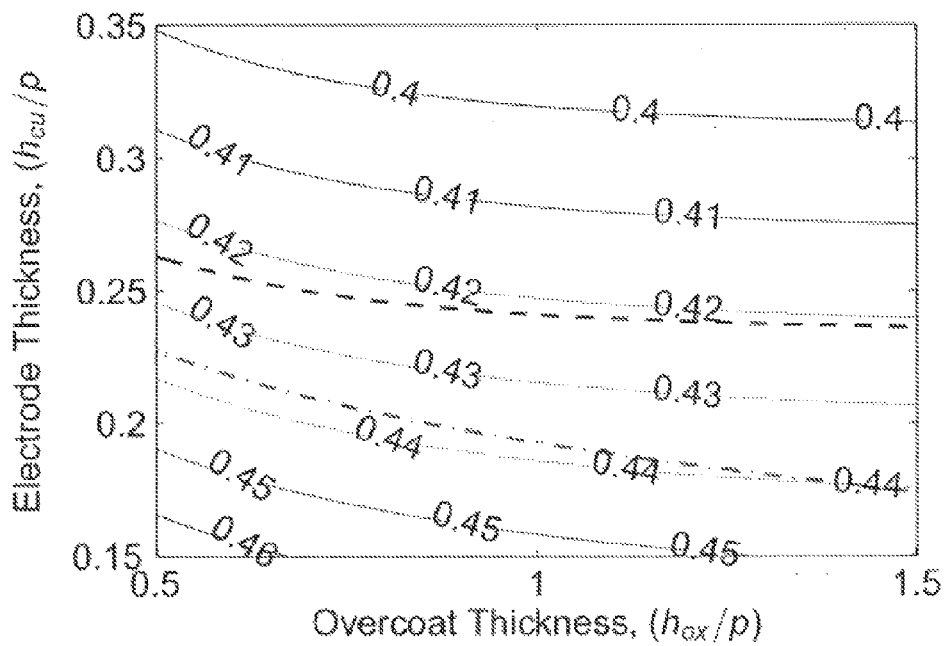
FIG. 5 is a graph displaying example resonance coefficients for a resonator using a copper electrode, in accordance with various embodiments.

FIG. 5 depicts an example of resonance coefficients for a resonator using copper electrodes in one embodiment. The coefficients are depicted in terms of $(f_R*p/v_B)$ where $f_R$ is the resonance frequency of the resonator, p is the period of the copper electrodes in the resonator, and $v_B$ is the shear velocity of the bulk wave in the resonator, which in some embodiments may be on the order of 4,029.3 m/s. Notably, the values in FIG. 5 are given in normalized, or unitless terms. In other words, the value of 0.4 represents that for the given overcoat thickness, in terms of $(h_{ox}/p)$ and electrode thickness, given in terms of $h_{cu}/p$, the resonant frequency times the period, divided by the shear velocity of the bulk wave, may be equal to 0.4, 0.41, 0.42, or one of the other values depicted in FIG. 5

Figure 6:
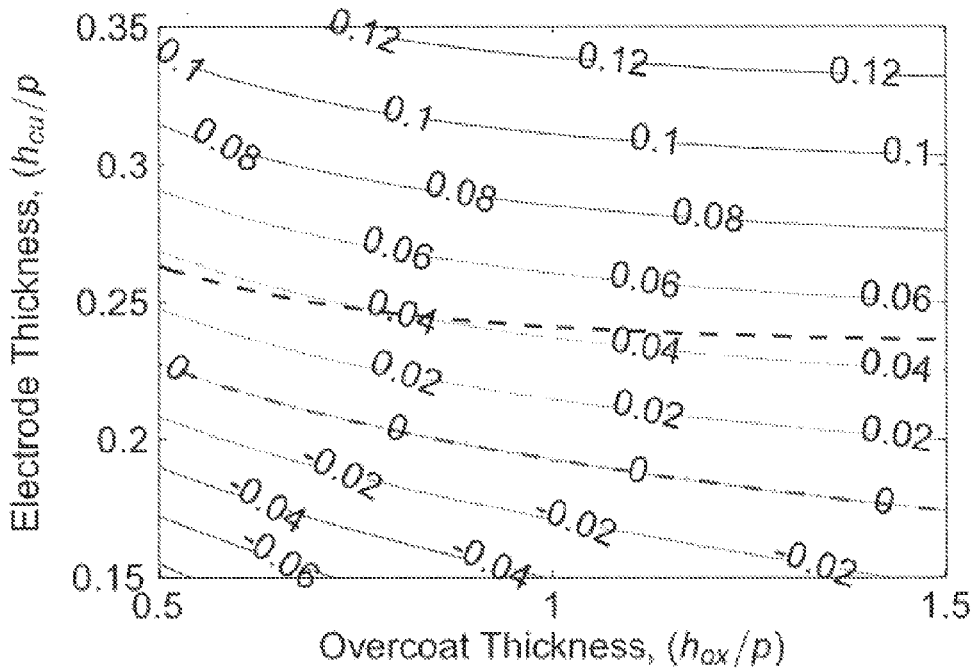
FIG. 6 is a graph displaying example cut-off margin coefficients for a resonator using a copper electrode, in accordance with various embodiments.

FIG. 6 depicts an example of coefficients for the cut-off margin for a resonator using copper electrodes in one embodiment. The coefficients are depicted in terms of $(\Delta f_C*p/v_B)$ where $\Delta f_C$ is the cut-off margin of the resonator, p is the period of the copper electrodes, and $v_B$ is the bulk wave velocity, as described above. It will be noted that the values shown in FIG. 6 are unitless, and may be interpreted as described above with reference to FIG. 5.

Figure 7:
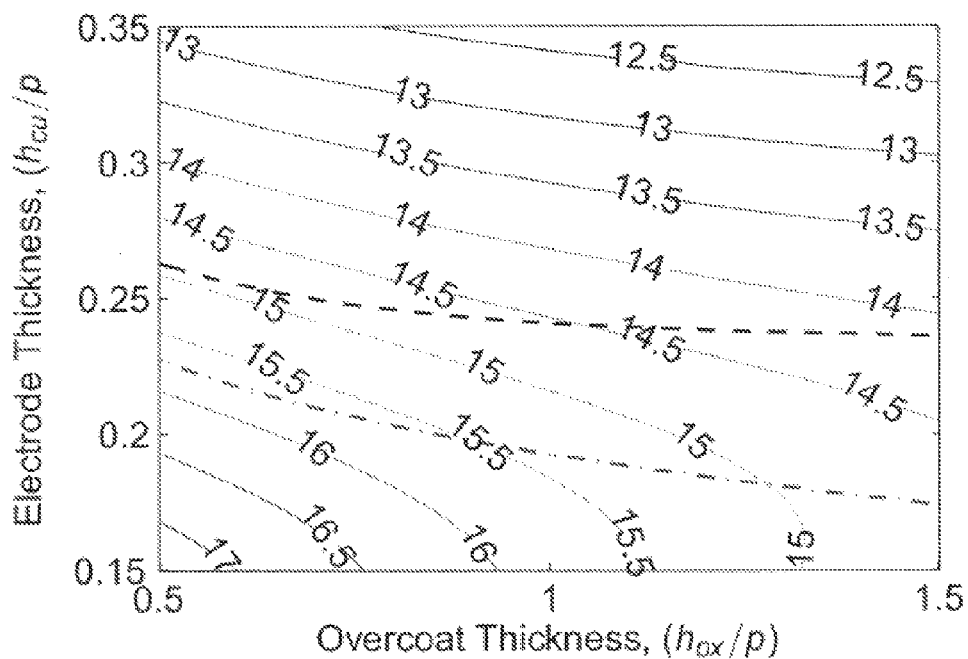
FIG. 7 is a graph displaying example coupling coefficients for a resonator using a copper electrode, in accordance with various embodiments.

FIG. 7 depicts an example of coupling coefficients $K^2$ for a resonator using a copper electrode in one embodiment. The coefficients may be generally referred to as "percentages" wherein the value 12.5 corresponds to 12.5%, 13 corresponds to 13%, etc. In embodiments, the percentages may be interpreted to indicate that the value of K2 is equal to the percentage divided by 100. In other words, 12.5% may correspond to $K^2=0.125$. In embodiments, a higher coupling coefficient may be desirable and relate to a more desirable configuration of the PBAW device 10 and copper electrode.

Figure 8:
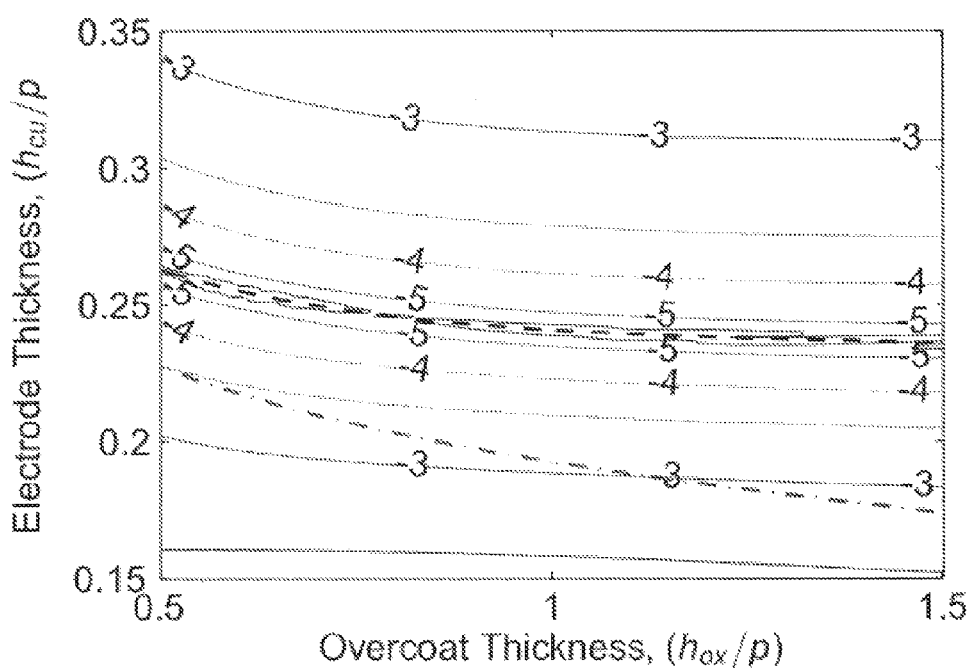
FIG. 8 is a graph displaying example spurious mode coupling coefficients for a resonator using a copper electrode, in accordance with various embodiments.

FIG. 8 depicts an example of spurious mode coupling coefficients for a resonator using a copper electrode in one embodiment. The spurious mode coupling coefficients are depicted as $K^2$, and represented in terms of ($\log_{10}$). In other words, the value of −5 may be interpreted as $\log_{10}(K^2)=-5$, or $K^2=0.0001$. As described above, spurious modes may negatively impact performance of the PBAW device 10, and so it may be desirable for the spurious mode coupling coefficient to be as low as possible.

In embodiments, the copper electrode may have a density $\Delta_{cu}$ of about 8.94 kg/m$^3$. The copper electrode may further have a shear modulus $c_{cu}$ of 48 about GPa. It may be seen, for example in FIG. 8, that the copper electrodes in the resonator may have values for $h_{cu}/p$ of roughly 0.259 when $h_{ox}/p$ is equal to 1.5.

Figure 9:
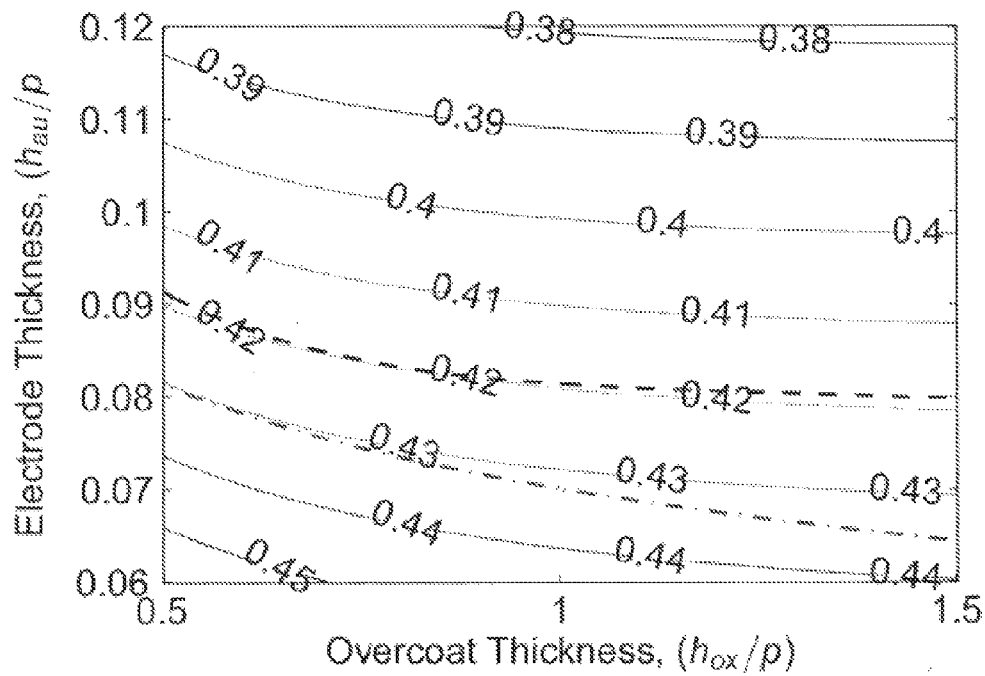
FIG. 9 is a graph displaying example resonance coefficients for a resonator using a gold electrode, in accordance with various embodiments.
Figure 10:
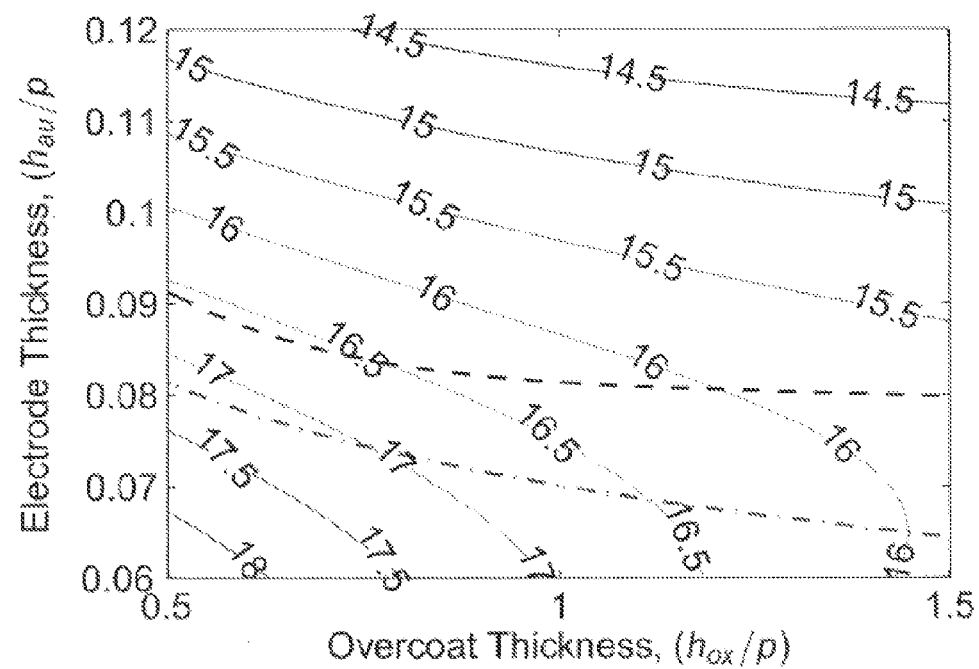
FIG. 10 is a graph displaying example coupling coefficients for a resonator using a gold electrode, in accordance with various embodiments.
Figure 11:
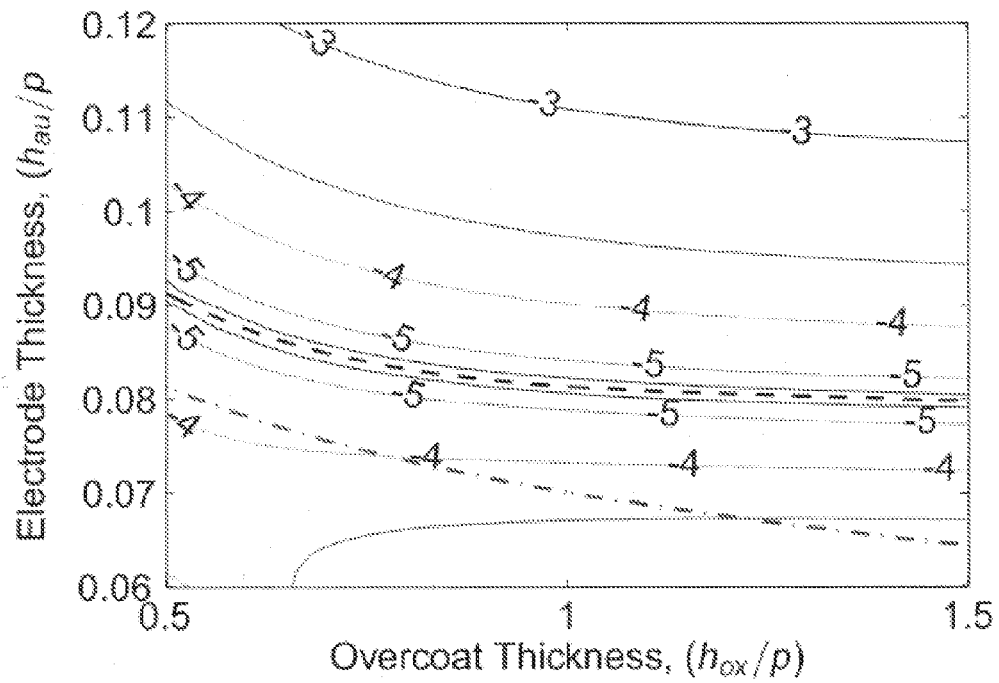
FIG. 11 is a graph displaying example spurious mode coupling coefficients for a resonator using a gold electrode, in accordance with various embodiments.

FIG. 9 depicts an example of frequency coefficients for a resonator using a gold electrode in one embodiment in a manner similar to FIG. 5, discussed above. Similarly, FIG. 10 depicts an example of coupling coefficients for a resonator using a gold electrode in one embodiment in a manner similar to FIG. 7, discussed above. Similarly, FIG. 11 depicts an example of spurious mode coupling coefficients for a resonator using a gold electrode in one embodiment in a manner similar to FIG. 8, discussed above. In embodiments, the gold electrode may have a density $\Delta_{au}$ of about 19.3 kg/m$^3$. The gold electrode may further have a shear modulus $c_{au}$ of about 27 GPa. It may be seen, for example in FIG. 11, that the gold electrodes in the resonator may have values for $h_{au}/p$ of roughly 0.085 when $h_{ox}/p$ is equal to 1.5.

Figure 12:
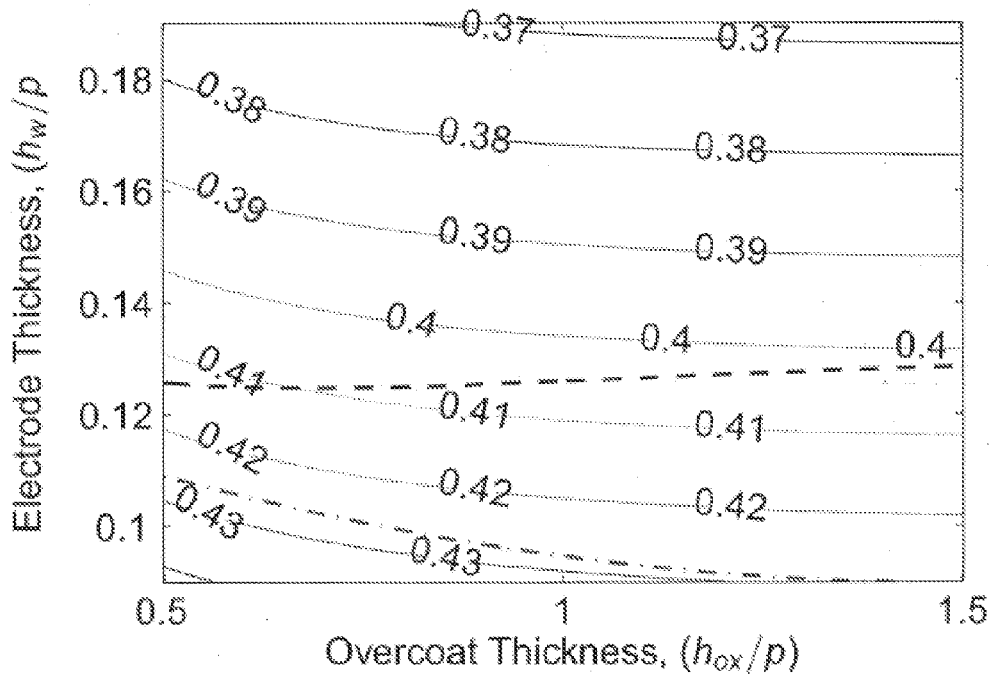
FIG. 12 is a graph displaying example resonance coefficients for a resonator using a tungsten electrode, in accordance with various embodiments.
Figure 13:
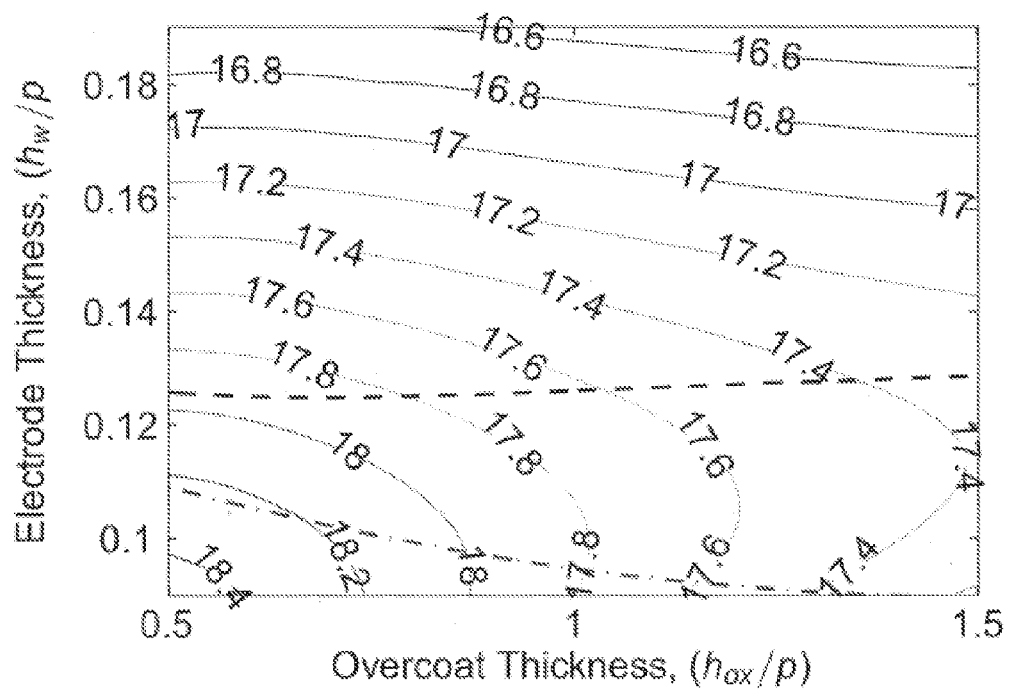
FIG. 13 is a graph displaying example coupling coefficients for a resonator using a tungsten electrode, in accordance with various embodiments.
Figure 14:
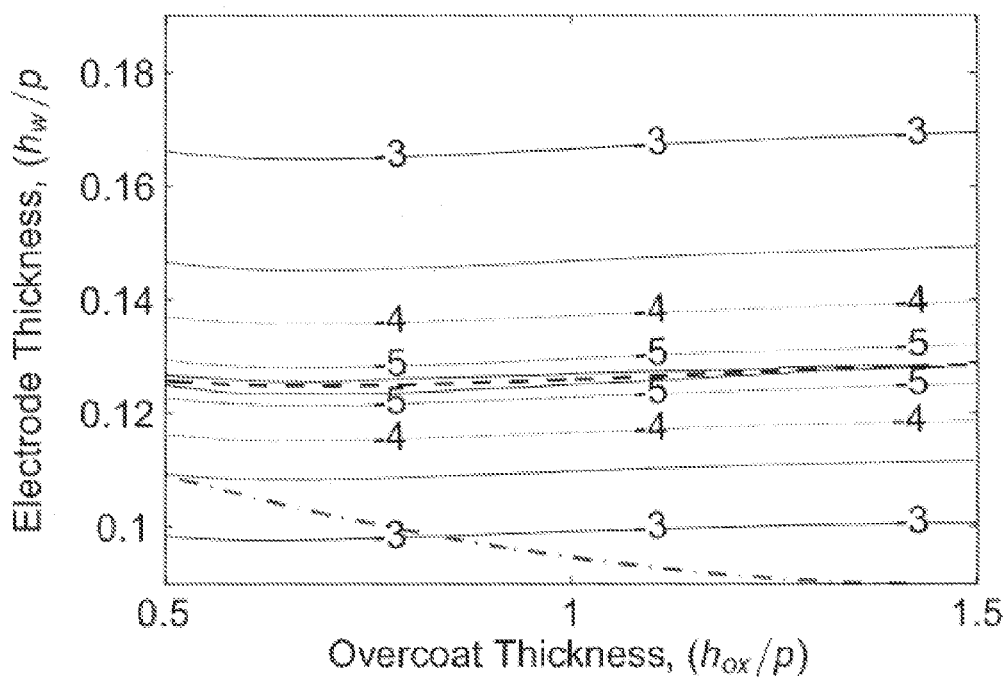
FIG. 14 is a graph displaying example spurious mode coupling coefficients for a resonator using a tungsten electrode, in accordance with various embodiments.

FIG. 12 depicts an example of frequency coefficients for a resonator using a tungsten electrode in one embodiment in a manner similar to FIG. 5, discussed above. Similarly, FIG. 13 depicts an example of coupling coefficients for a resonator using a tungsten electrode in one embodiment in a manner similar to FIG. 7, discussed above. Similarly, FIG. 14 depicts an example of spurious mode coupling coefficients for a resonator using a tungsten electrode in one embodiment in a manner similar to FIG. 8, discussed above. In embodiments, the tungsten electrode may have a density $\Delta_w$ of about 19.25 kg/m$^3$. The tungsten electrode may further have a shear modulus $c_w$ of about 161 GPa. It can be seen, for example in FIG. 14, that the electrodes in the resonator using the tungsten electrode may have values for $h_w/p$ of roughly 0.129 when $h_{ox}/p$ is equal to 1.5.

With review of FIGS. 5-14, and specifically FIGS. 8, 11 and 14, values for an electrode thickness divided by period of the electrodes, $h_m/p$ may be approximated to reduce or eliminate spurious modes. In embodiments where $h_{ox}$ may be equal to 1.5, as discussed above, $h_m/p$ may be approximately equal to $$h_m/p \approx \frac{2*\sqrt[4]{\left(\frac{c_m}{c_{ox}}\right)}}{3*\left(\frac{\Delta_m}{\Delta_{ox}}-1\right)}.$$

Figure 15:
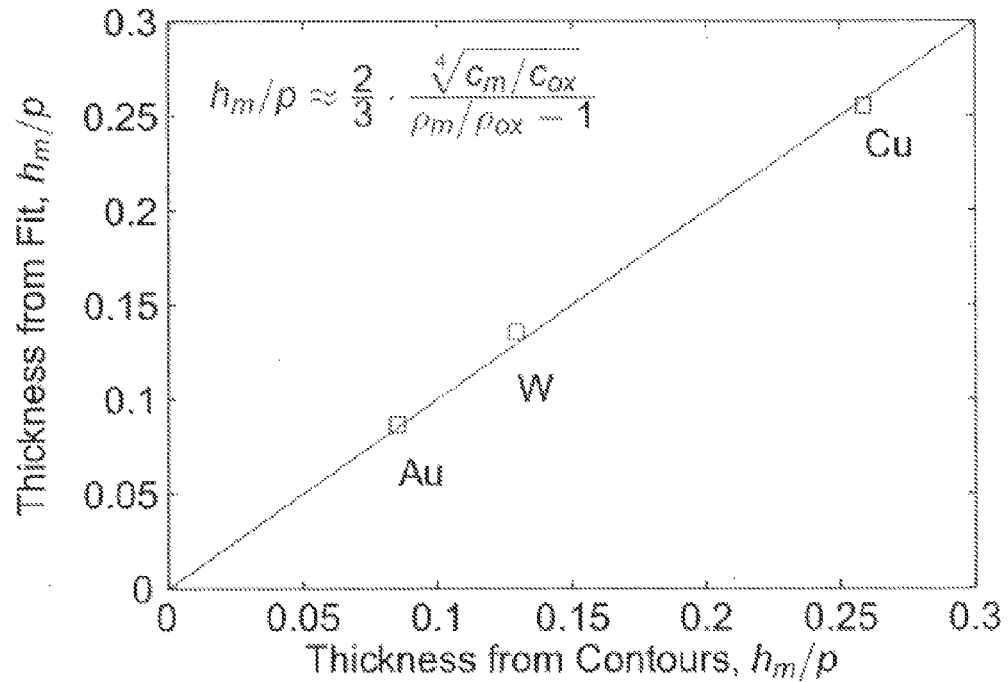
FIG. 15 is a graph displaying an example of a relationship between electrode height and electrode period, in accordance with various embodiments.

In embodiments, $c_m$ may represent the shear modulus for the metal electrode as described above. $c_{ox}$ may represent the shear modulus for the dielectric overcoat 24 as described above. Similarly $\Delta_m$ may represent the density of the metal electrode, and $\Delta_{ox}$ may represent the density of the dielectric overcoat 24 as described above. In embodiments, $c_{ox}$ may be equal to about 32 GPa, and $\Delta_{ox}$ may be equal to about 2.2 kg/m$^3$. As noted above, the sub-m ($x_m$) notation may be expanded such that sub-cu represents the copper electrode, sub-w represents the tungsten electrode, sub-au represents the gold electrode, etc. FIG. 15 represents an exemplary fit of the equation above to the data determined from the contours in FIGS. 5-14, and more specifically FIGS. 8, 11, and/or 14, as described above.

As noted above, the above described equation is most applicable to a value for $h_{ox}/p$ of 1.5. In other embodiments, thinner dielectric overcoats 24 may result in thicker electrodes. In other words, the height of the dielectric overcoat 24 may be inversely proportional to the height of the electrode in the resonator, and the equation described above may be modified appropriately with reference to FIGS. 8, 11, and/or 14.

Duty Factor

In embodiments, the duty factor, or a/p, for electrodes in a resonator such as electrodes 30 or 30A, may affect the amount to which a spurious mode due to that resonator may be suppressed in a PBAW device 10. In some embodiments, the electrode height $h_m$ may be unchangeable from resonator to resonator on a PBAW device. Additionally, the electrode period p may be similarly unchangeable within a resonator or from resonator to resonator. Therefore, the electrode width may be altered such that the duty factor is changed and a spurious mode may be suppressed.

Figure 16:
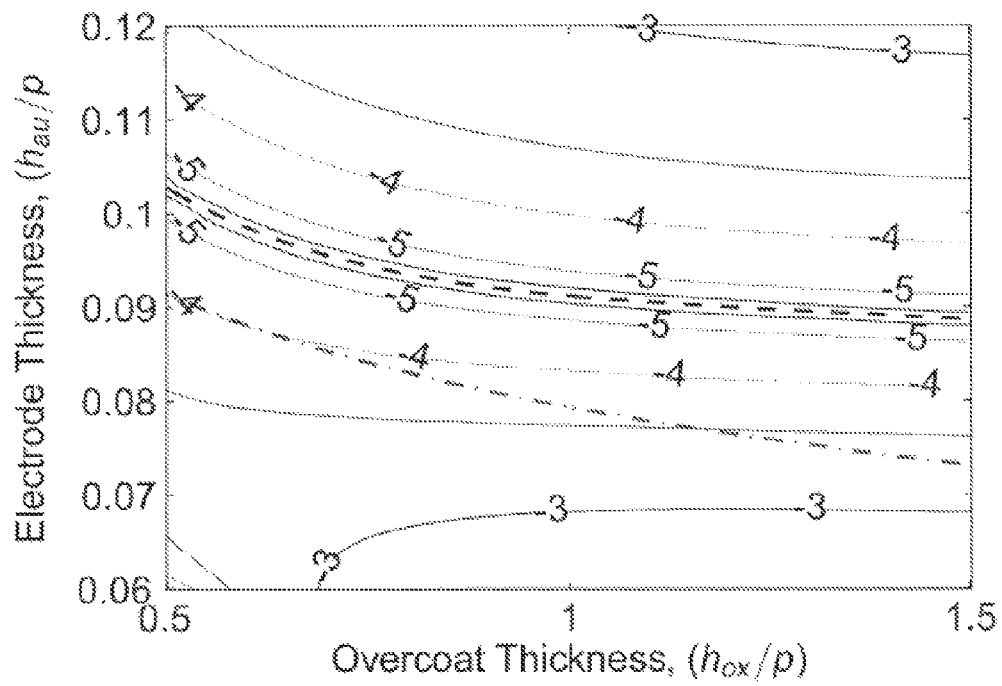
FIG. 16 is a graph displaying example spurious mode coupling coefficients for a resonator using a gold electrode with a duty factor of 40%, in accordance with various embodiments.
Figure 17:
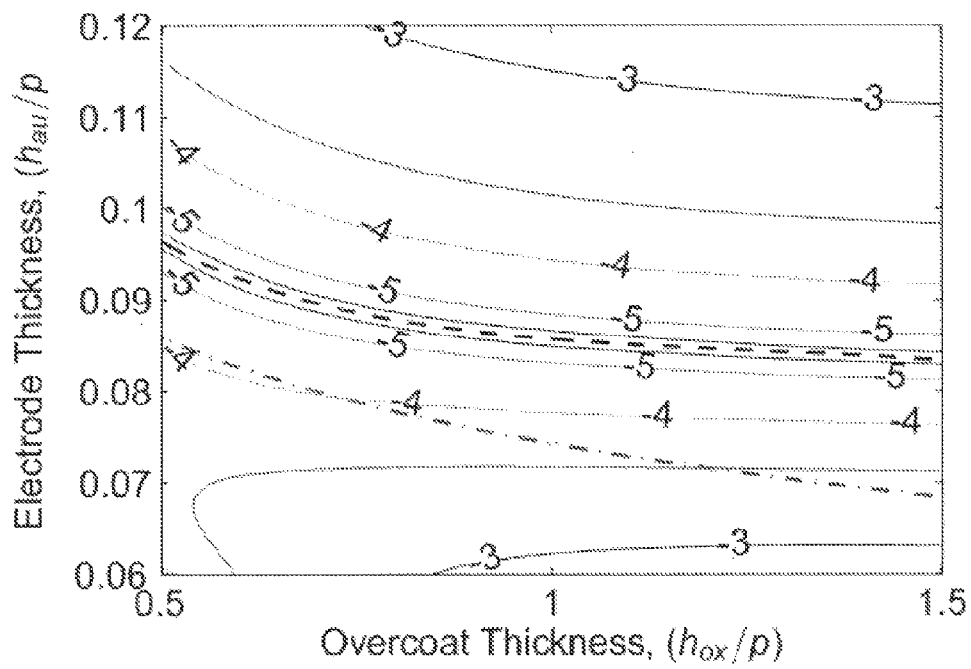
FIG. 17 is a graph displaying example spurious mode coupling coefficients for a resonator using a gold electrode with a duty factor of 45%, in accordance with various embodiments.
Figure 18:
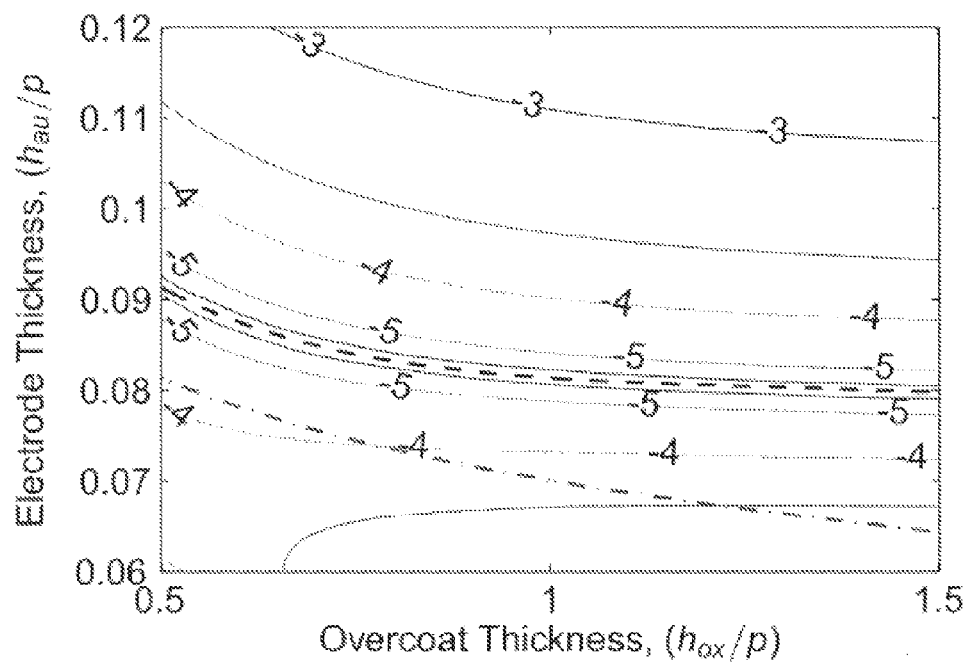
FIG. 18 is a graph displaying example spurious mode coupling coefficients for a resonator using a gold electrode with a duty factor of 50%, in accordance with various embodiments.
Figure 19:
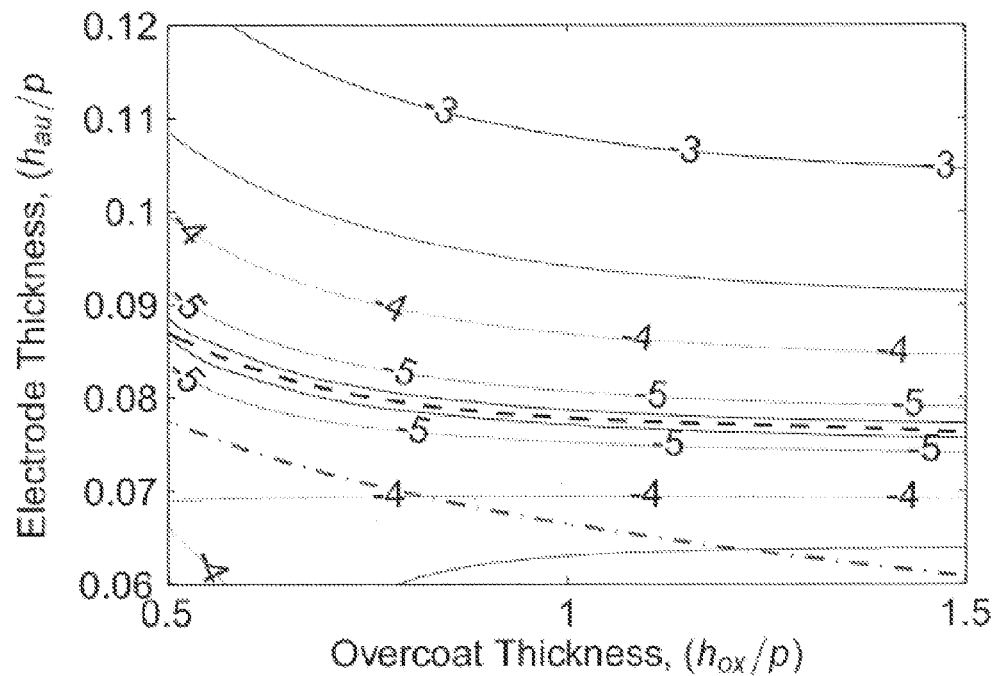
FIG. 19 is a graph displaying example spurious mode coupling coefficients for a resonator using a gold electrode with a duty factor of 55%, in accordance with various embodiments.
Figure 20:
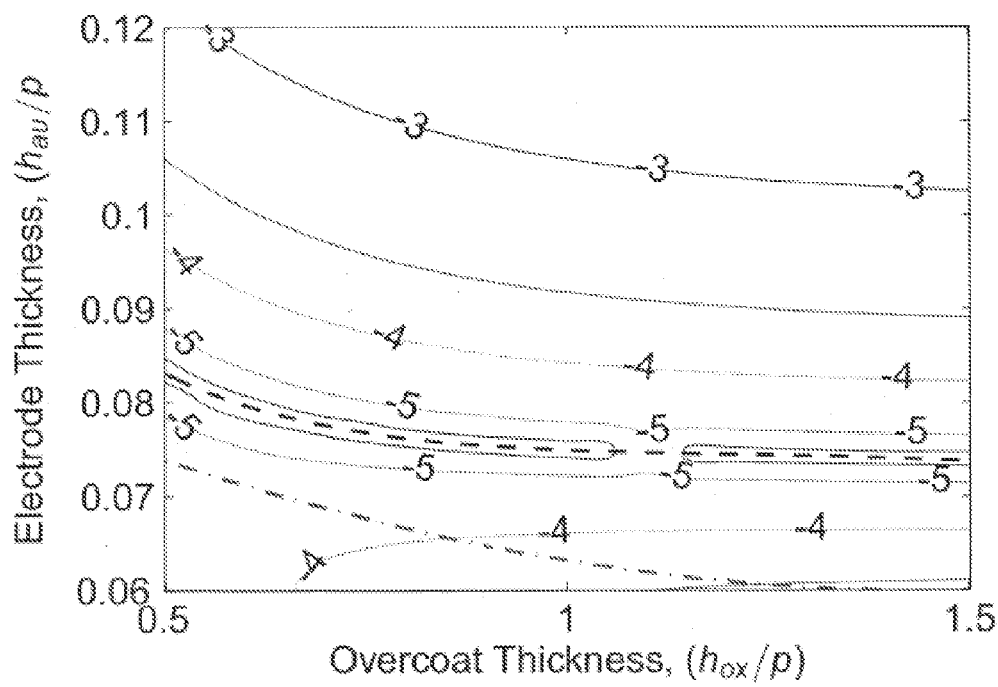
FIG. 20 is a graph displaying example spurious mode coupling coefficients for a resonator using a gold electrode with a duty factor of 60%, in accordance with various embodiments.

FIG. 16 depicts an example graph of spurious mode coupling coefficients of a resonator using a gold electrode in one embodiment. The spurious mode coupling coefficients are notated as $K^2$, and represented in terms of ($\log_{10}$), similarly to the coefficients described above with respect to FIG. 8. In the embodiment shown in FIG. 16, the duty factor a/p of the gold electrode may be equal to 0.40, or 40%. FIG. 17 is likewise an example graph of spurious mode coupling coefficients of a resonator using a gold electrode which, in this embodiment, may have a duty factor a/p of 0.45, or 45%. FIG. 18 is likewise an example graph of spurious mode coupling coefficients of a resonator using a gold electrode which, in this embodiment, may have a duty factor a/p of 0.50, or 50%. FIG. 19 is likewise an example graph of spurious mode coupling coefficients of a resonator using a gold electrode which, in this embodiment, may have a duty factor a/p of 0.55, or 55%. FIG. 20 is likewise an example graph of spurious mode coupling coefficients of a resonator using a gold electrode which, in this embodiment, may have a duty factor a/p of 0.60, or 60%.

Effect of Y-Rotation

Figure 21:
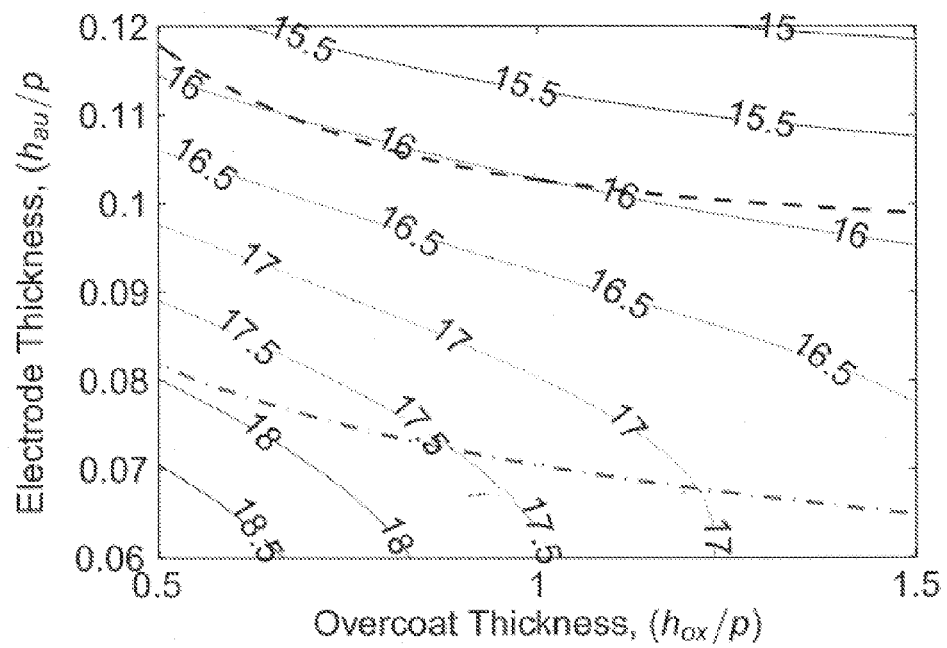
FIG. 21 is a graph displaying example coupling coefficients for a resonator using a gold electrode on an 18 degree y-rotated, x-propagating substrate, in accordance with various embodiments.
Figure 22:
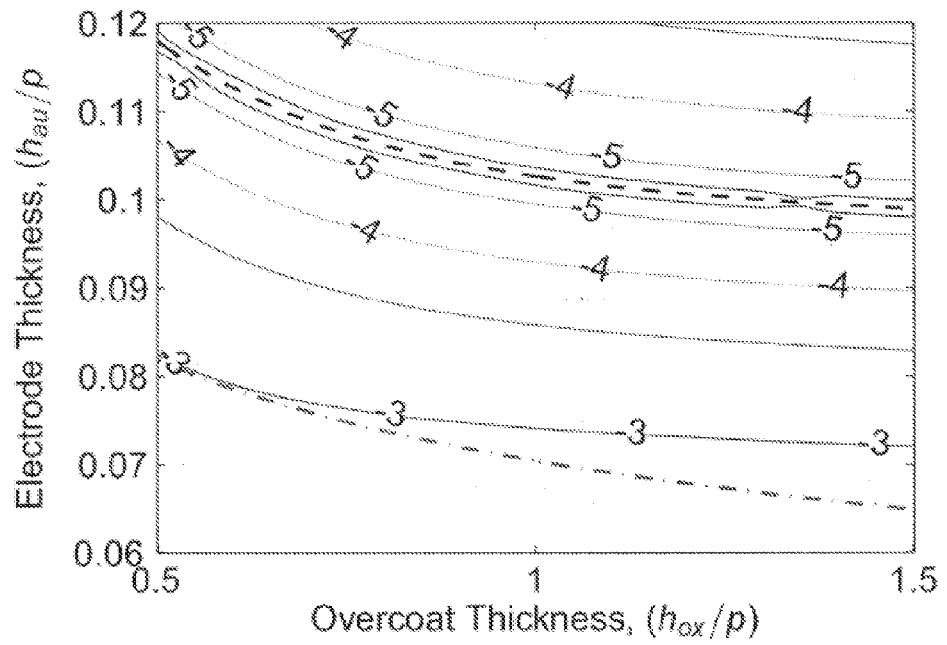
FIG. 22 is a graph displaying example spurious mode coupling coefficients for a resonator using a gold electrode on an 18 degree y-rotated, x-propagating substrate, in accordance with various embodiments.
Figure 23:
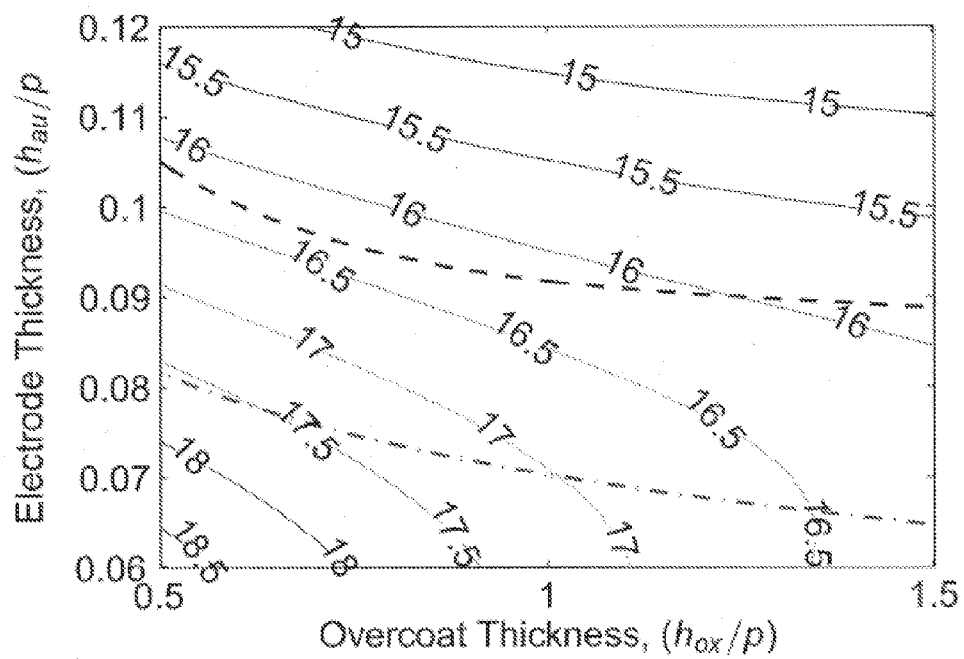
FIG. 23 is a graph displaying example coupling coefficients of a resonator using a gold electrode on a 20 degree y-rotated, x-propagating substrate, in accordance with various embodiments.
Figure 24:
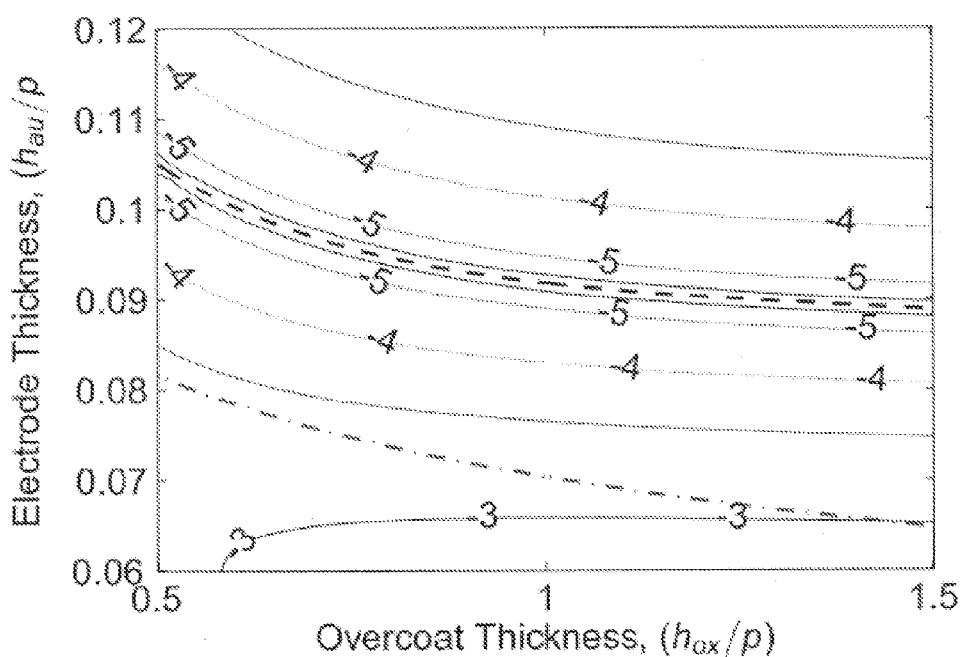
FIG. 24 is a graph displaying example spurious mode coupling coefficients of a resonator using a gold electrode on a 20 degree y-rotated, x-propagating substrate, in accordance with various embodiments.
Figure 25:
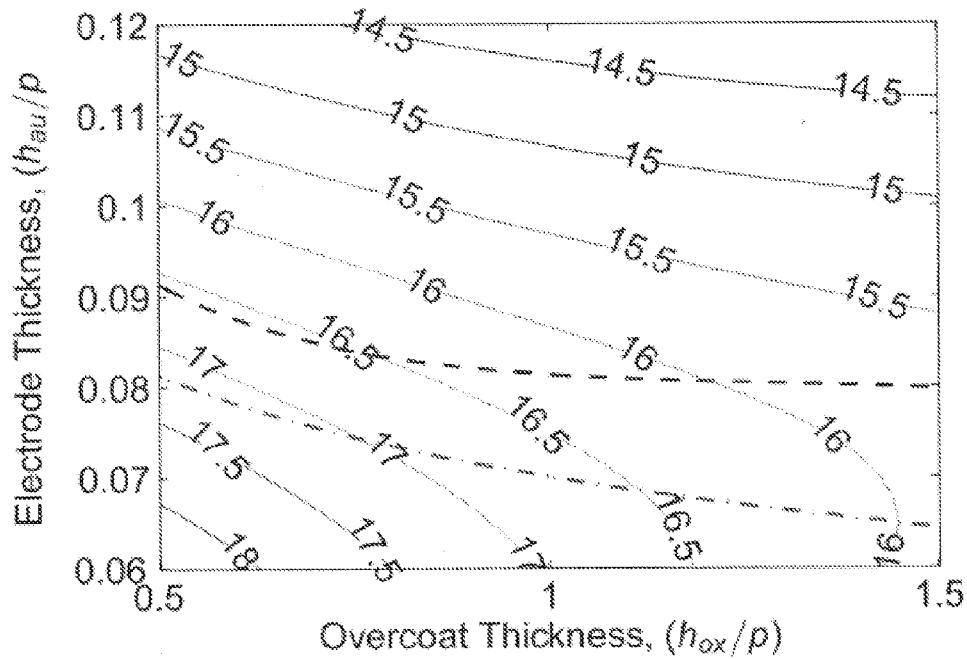
FIG. 25 is a graph displaying example coupling coefficients of a resonator using a gold electrode on a 22 degree y-rotated, x-propagating substrate, in accordance with various embodiments.
Figure 26:
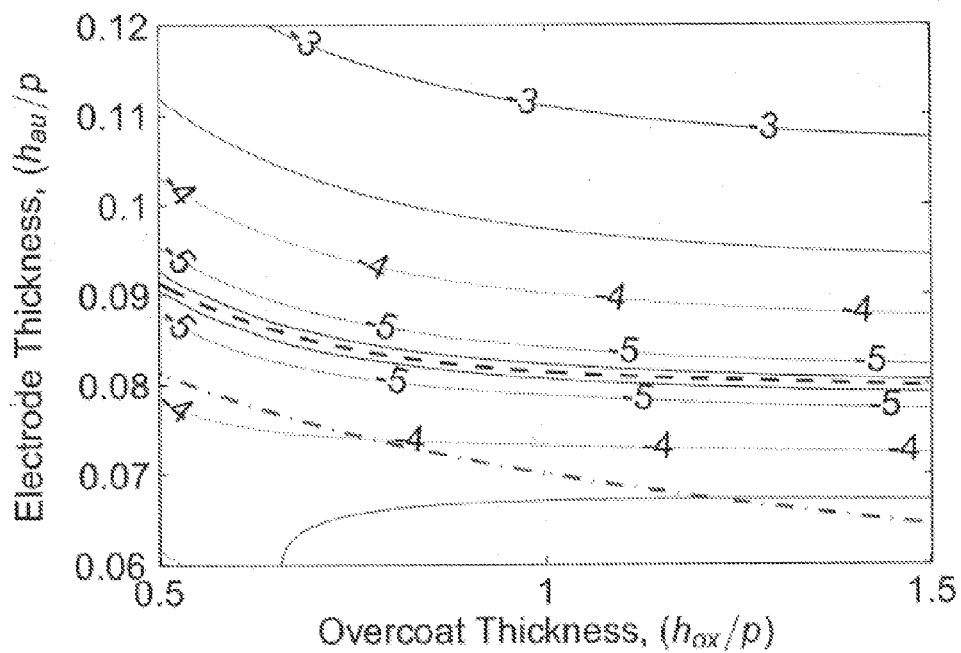
FIG. 26 is a graph displaying example spurious mode coupling coefficients of a resonator using a gold electrode on a 22 degree y-rotated, x-propagating substrate, in accordance with various embodiments.
Figure 27:
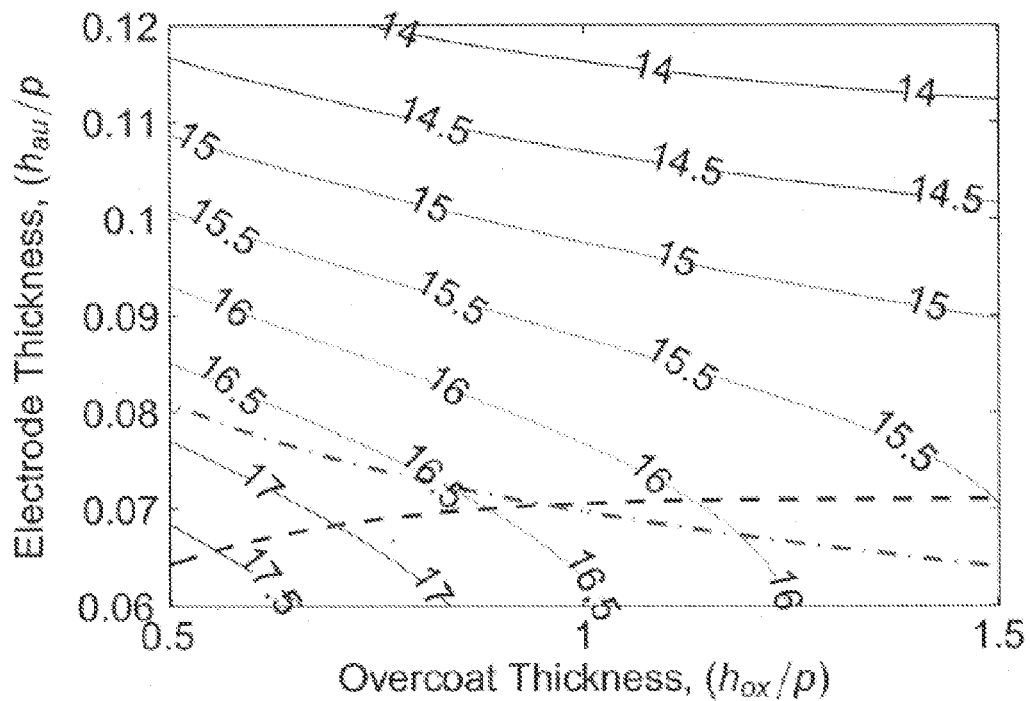
FIG. 27 is a graph displaying example coupling coefficients of a resonator using a gold electrode on a 24 degree y-rotated, x-propagating substrate, in accordance with various embodiments.
Figure 28:
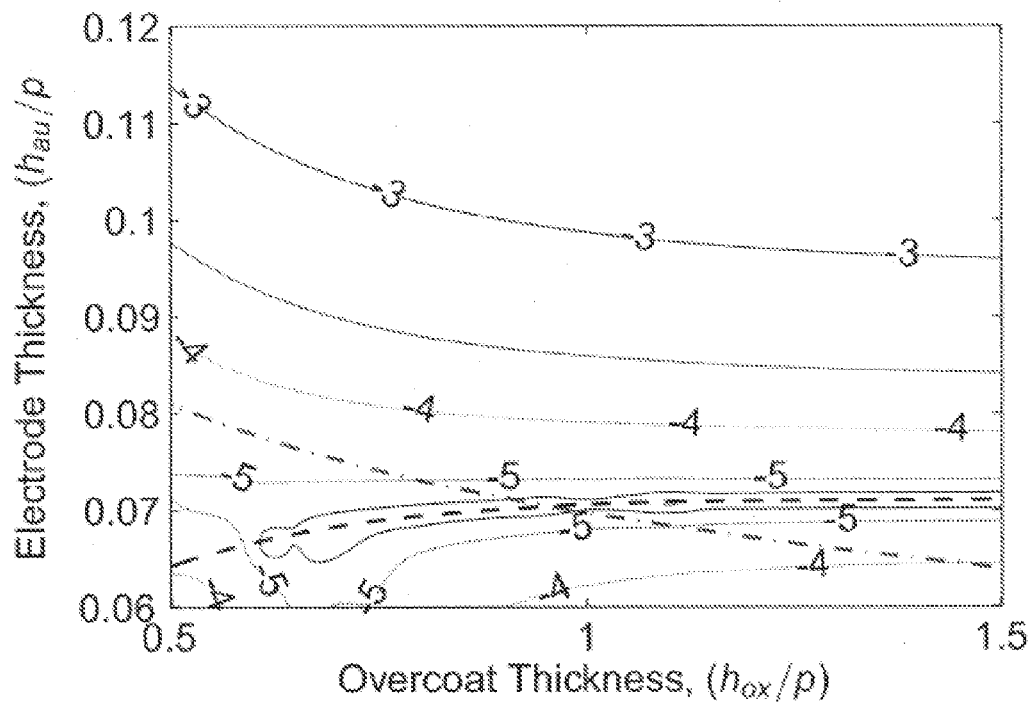
FIG. 28 is a graph displaying example spurious mode coupling coefficients of a resonator using a gold electrode on a 24 degree y-rotated, x-propagating substrate, in accordance with various embodiments.

In some embodiments, the y-rotation of the substrate 12 may likewise affect the presence or suppression of spurious modes in a PBAW device 10. FIG. 21 is an example graph of coupling coefficients of a resonator using a gold electrode on an 18° y-rotated YX-LN substrate, such as substrate 12 according to one embodiment. The coupling coefficients may be interpreted similarly to the coupling coefficients described above with respect to FIG. 7. FIG. 22 is an example graph of spurious mode coupling coefficients of a resonator using a gold electrode on an 18° y-rotated YX-LN substrate, such as substrate 12 according to one embodiment. The spurious mode coupling coefficients are depicted as $K^2$, and represented in terms of ($\log_{10}$), similarly to the coefficients described above with respect to FIG. 8.

Similarly to FIG. 21, FIGS. 23, 25, and 27 are example graphs of coupling coefficients of resonators using a gold electrode on a 20°, 22°, and 24° y-rotated YX-LN substrate, respectively, such as substrate 12 according to one embodiment. Similarly to FIG. 22, FIGS. 24, 26, and 28 are example graphs of spurious mode coupling coefficients of resonators using a gold electrode on a 20°, 22°, and 24° y-rotated YX-LN substrate, such as substrate 12 according to one embodiment.

Figure 29:
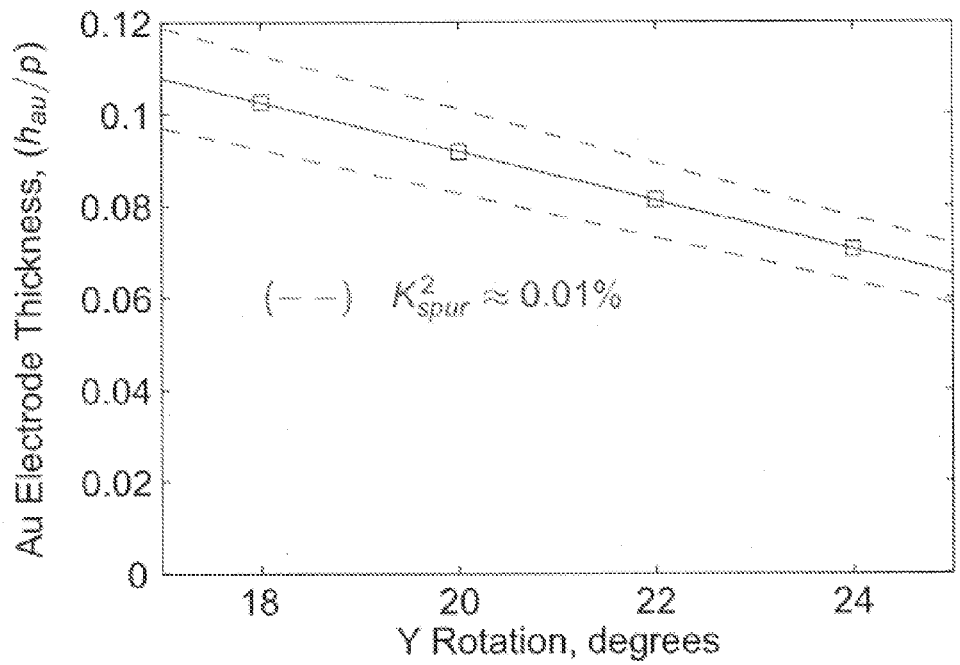
FIG. 29 is a graph displaying an example of a relationship of spurious mode coupling coefficients of a resonator using a gold electrode to substrate Y-rotation and electrode thickness, in accordance with various embodiments.

FIG. 29 is an example graph which may be interpreted as summarizing data of FIGS. 21, 23, 25, and 27. Specifically, FIG. 29 depicts electron thickness ($h_{au}/p$) where spurious mode coupling coefficients approximately close to 0 may be realized for 18°, 20°, 22°, and 24° y-rotated YX-LN substrates such as substrate 12 in embodiments where $h_{ox}/p$ is approximately 1. In embodiments, the dashed lines may be interpreted as representing ranges of electron thickness where the spurious mode coupling coefficients may approach 0.

Figure 30:
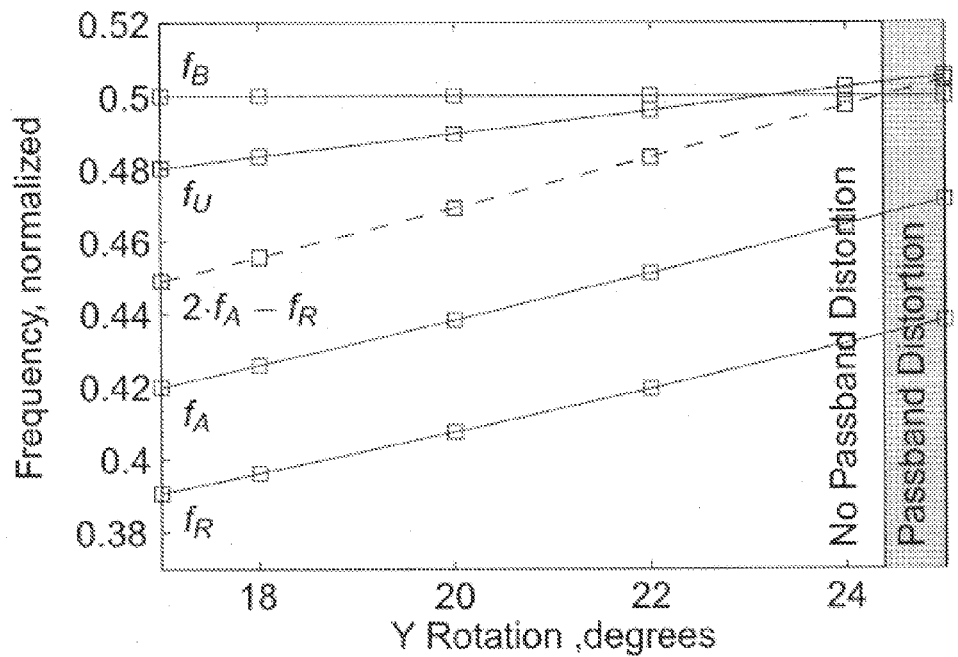
FIG. 30 is a graph displaying an example of a relationship of frequency variables to substrate Y-rotation, in accordance with various embodiments.

FIG. 30 is an example graph displaying normalized frequency coefficients, for example the normalized frequency coefficients described above with respect to FIG. 5, for a PBAW device as a function of y-rotation of the YX-LN substrate such as substrate 12 for embodiments where $h_{ox}/p$ is approximately equal to 1. Specifically, normalized coefficients are depicted for $f_B$, $f_U$, $2*f_A-f_R$, $f_A$, and $f_R$, as described above with respect to FIG. 4. As can be seen for normalized frequency coefficients between approximately 0.39 and 0.5, no passband distortion may be observed in embodiments where the y-rotation of the YX-LN substrate is between 18° and 24°. In embodiments where the y-rotation of the YX-LN is greater than approximately 24°, then passband distortion may be observed. In some embodiments, the passband distortion may be due to the introduction of spurious modes to the PBAW device 10.

Figure 31:
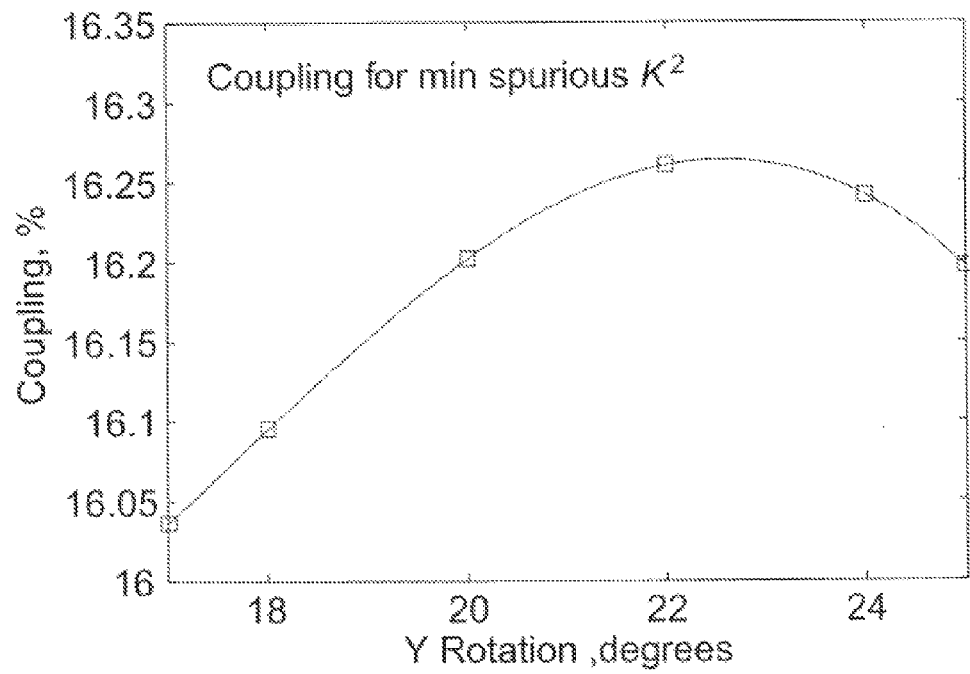
FIG. 31 is a graph displaying an example of a relationship of coupling coefficients to substrate Y-rotation, in accordance with various embodiments.

FIG. 31 depicts an example graph displaying the relationship between the coupling coefficients of a resonator using a gold electrode, for example the coupling coefficients described above with respect to FIG. 7, as a function of y-rotation of the YX-LN substrate such as substrate 12 for embodiments where $h_{ox}/p$ is approximately equal to 1. Specifically, the coupling coefficients where the spurious mode coupling coefficient may be lowest, for example as shown in FIGS. 21, 23, 25, and 27 may be shown in FIG. 31.

Application

With reference to FIG. 1, in embodiments, a PBAW device such as PBAW device 10 may be constructed using a variety of resonators such as resonators 14 and 16 with a plurality of respective periods 28 and 28A. In embodiments, the period 28 of a resonator 14 may be directly tied to the resonant frequency $f_R$ of the PBAW device 10 including the resonator 14. Additionally, the electrode periods 28 and 28A of a PBAW device 10 may be proportionally tied to the fractional bandwidth of the PBAW device 10. Specifically, variation in the electrode periods 28 and 28A of a PBAW device may be proportional to the fractional bandwidth of the PBAW device 10. In addition, the bandwidth of the PBAW device 10 may approximate one-quarter to one-half of the coupling coefficient of the PBAW device 10, for example the coupling coefficient described above with respect to FIG. 7. Finally, for PBAW devices 10 which include a YX-LN substrate such as substrate 12 with a y-rotation between 18° and 24°, the electrode period 28 and 28A may in some embodiments vary at least as much as the fractional bandwidth from resonator to resonator. In some cases, this variation may be between 4 and 8%. Because the coupling coefficients of the spurious mode may be so closely related to period, as shown above, it may be difficult to maintain spurious mode suppression over a variation in period of resonators in a PBAW device between 4% and 8%.

However, as noted above, a change in the duty factor (a/p) of a resonator such as resonators 14 or 16 of a PBAW device 10 may produce a shift in the location of the approximately spurious free response of the PBAW device 10, as discussed above with respect to FIGS. 16-20. In general, a larger duty factor may provide an approximately spurious free response for resonators with larger relative electrode periods. Similarly, smaller duty factors may provide an approximately spurious free response for resonators with smaller relative electrode periods. In embodiments, an electrode's duty factor may be varied as the period of the resonator changes by changing the electrode width. By changing the duty factors of the resonators, an approximately spurious free response may be provided for some or all resonators of a PBAW device. In these embodiments, the ratio of the height of the dielectric overcoat 24, $h_{ox}$, to the electrode thickness, $h_m$, may be considered to be approximately constant for all resonators in a PBAW device.

Figure 32:
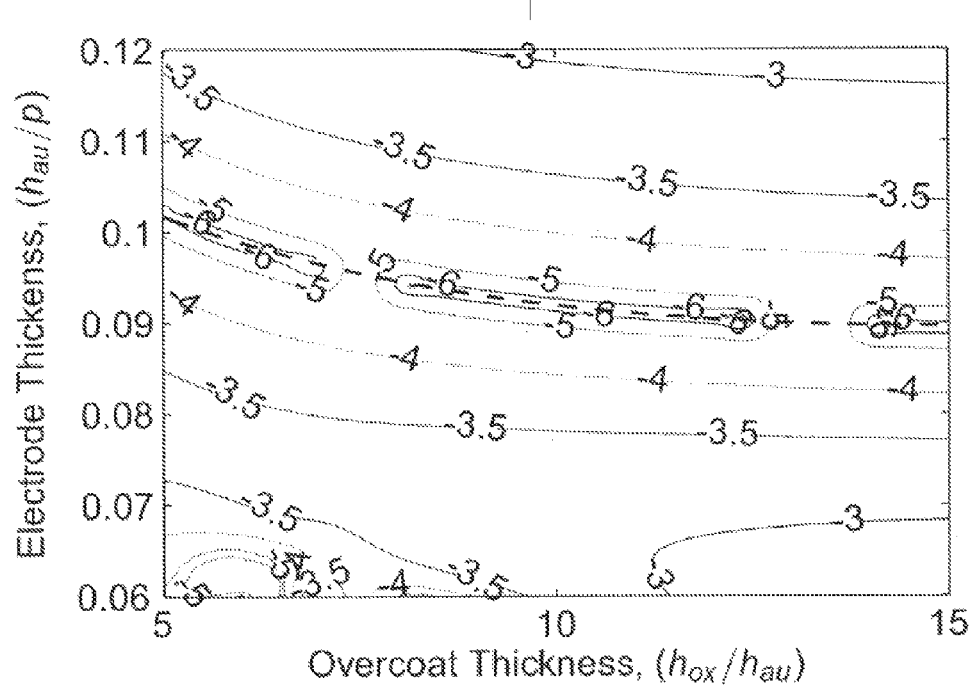
FIG. 32 is a graph displaying example spurious mode coupling coefficients of a resonator using a gold electrode with a duty factor of 40%, in accordance with various embodiments.
Figure 33:
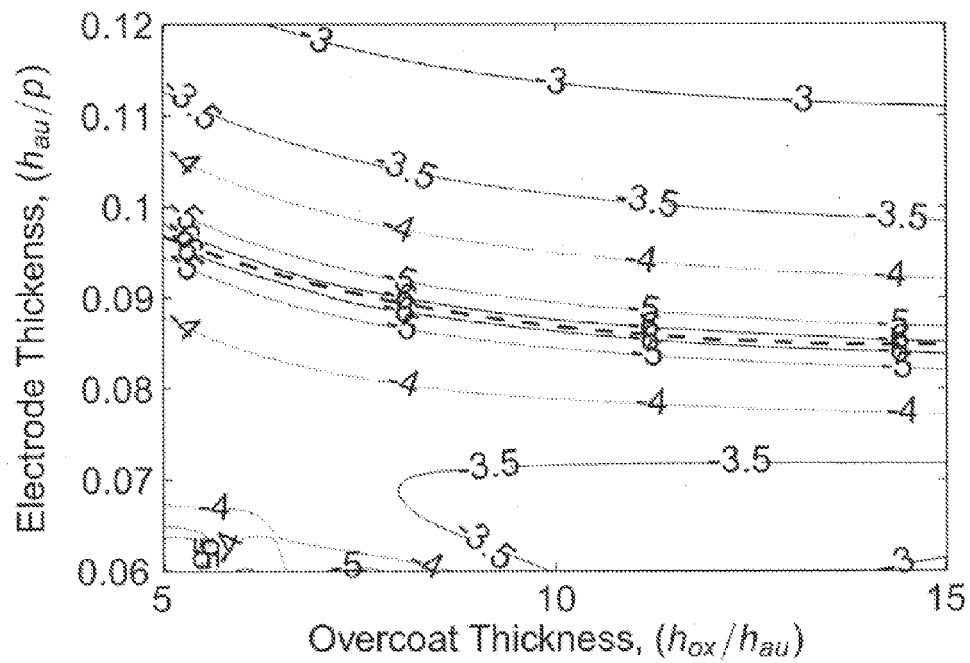
FIG. 33 is a graph displaying example spurious mode coupling coefficients of a resonator using a gold electrode with a duty factor of 45%, in accordance with various embodiments.
Figure 34:
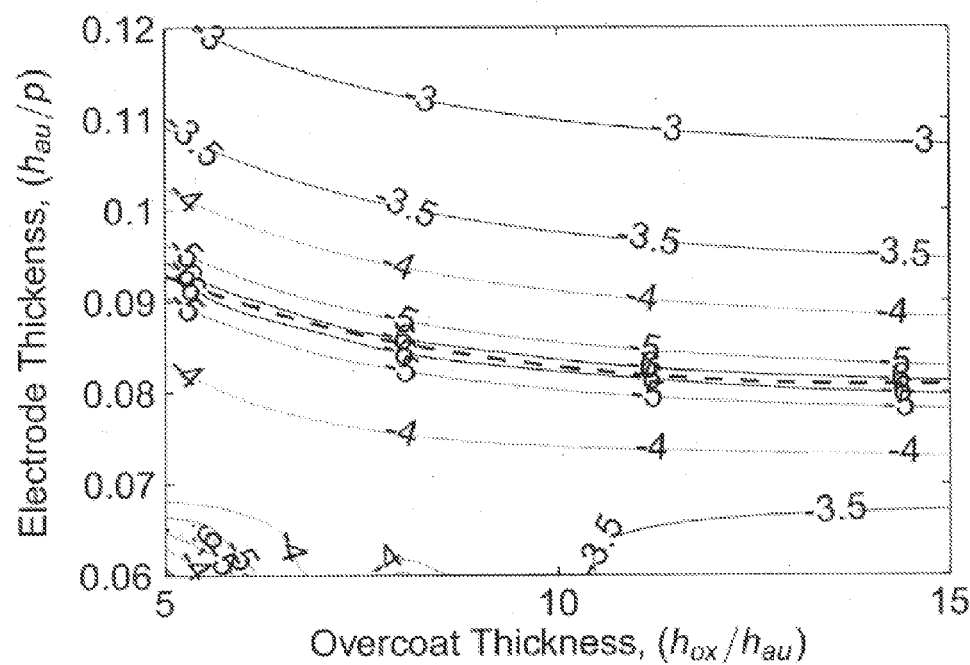
FIG. 34 is a graph displaying example spurious mode coupling coefficients of a resonator using a gold electrode with a duty factor of 50%, in accordance with various embodiments.
Figure 35:
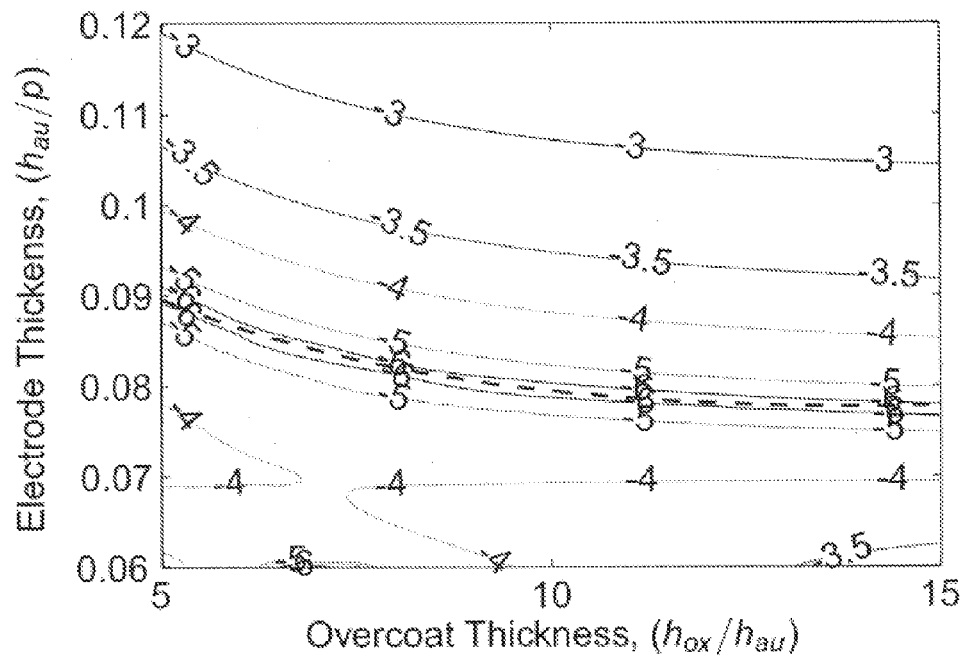
FIG. 35 is a graph displaying example spurious mode coupling coefficients of a resonator using a gold electrode with a duty factor of 55%, in accordance with various embodiments.
Figure 36:
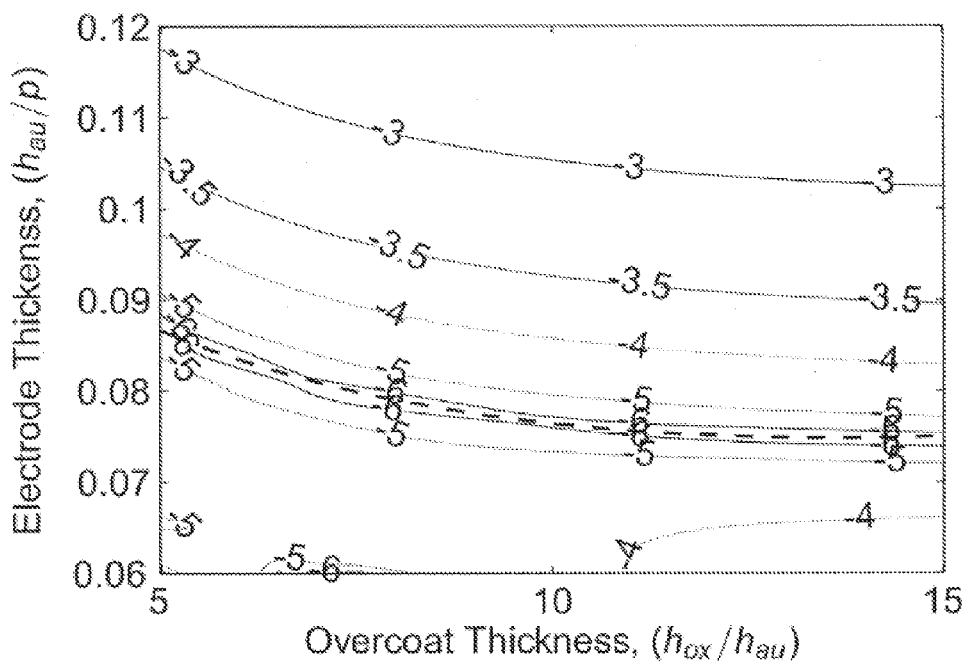
FIG. 36 is a graph displaying example spurious mode coupling coefficients of a resonator using a gold electrode with a duty factor of 60%, in accordance with various embodiments.
Figure 37:
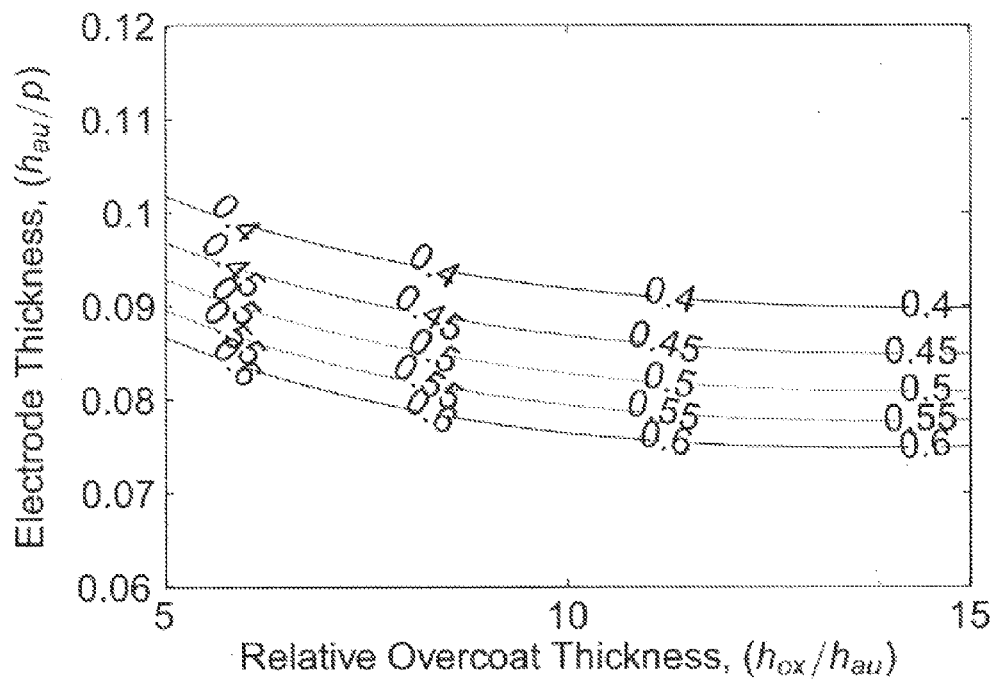
FIG. 37 is a graph displaying an example of a relationship of duty factors of electrodes in a resonator using a gold electrode with respect to thickness of layers in a PBAW device, in accordance with various embodiments.

FIG. 32 depicts an example graph of spurious mode coupling coefficients of a resonator using a gold electrode with a duty factor (a/p) of 40% as a function of $h_{au}/p$ and $h_{ox}/h_{au}$ according to one embodiment. The spurious mode coupling coefficients are notated as $K^2$, and represented in terms of ($\log_{10}$), similarly to the coefficients described above with respect to FIG. 8. FIGS. 33, 34, 35, and 36 likewise respectively depict example graphs of spurious mode coupling coefficients of resonators using a gold electrode with a duty factor (a/p) of 45%, 50%, 55%, and 60% according to various embodiments. FIG. 37 summarizes the data of FIGS. 32-36 by depicting an example graph of the comparison of $h_{au}/p$ and $h_{ox}/h_{au}$ to produce an approximately spurious-free response for the duty factors 40%, 45%, 50%, 55%, and 60% according to one embodiment.

In some embodiments, a PBAW device 10 may be designed by specifying a period p of a resonator, for example the period 28 of resonator 14 in FIG. 1. In these embodiments, the duty factor (a/p) of the resonator 14 may also be specified. In these embodiments, it may be more convenient to consider graphs that are a function of period to dielectric overcoat thickness. In these embodiments, a reference period $p_{ref}$ and a reference electrode width $a_{ref}$ may be defined. In embodiments, $a_{ref}/p_{ref}$ may be equal to 0.5. The reference period $p_{ref}$ and the reference width $a_{ref}$ may be nominal values of a resonator 14, a PBAW device 10, or some other value. The reference period $p_{ref}$ and width $a_{ref}$ may have a duty factor of 50% that, when used in a resonator with an electrode material height of $h_m$ and an overcoat thickness of height $h_{ox}$, provide a response with little or no spurious content.

Figure 38:
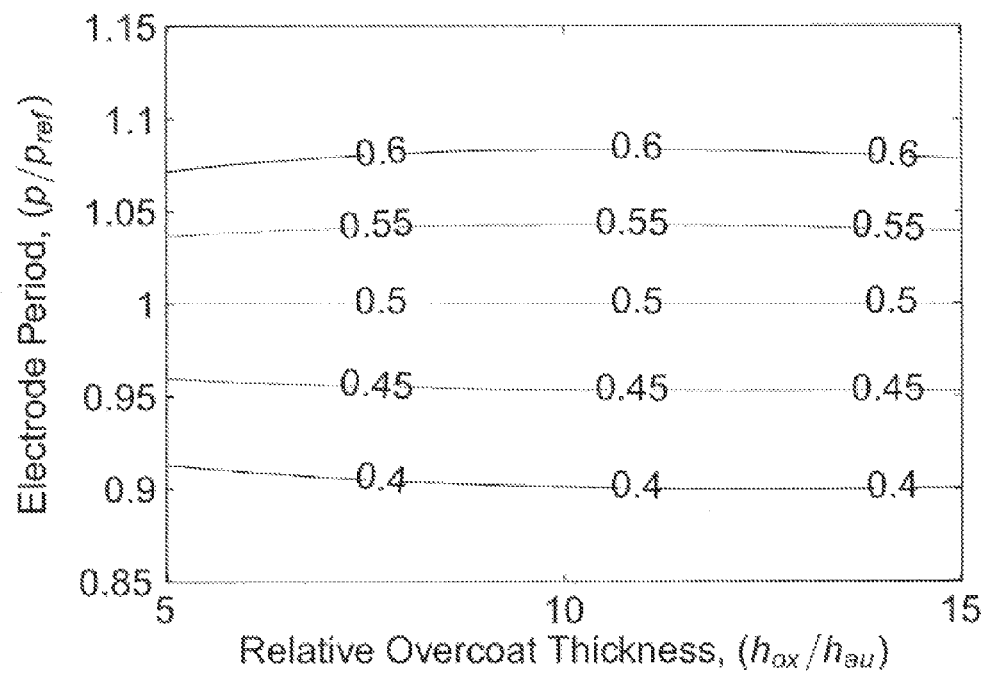
FIG. 38 is a graph displaying an example of a relationship of duty factors and period of electrodes in a resonator using a gold electrode, in accordance with various embodiments.

FIG. 38 is an interpretation of the data from FIG. 37 using the reference values discussed above. Specifically, as noted above, FIG. 37 summarizes the data of FIGS. 32-36 by depicting an example graph of the comparison of $h_{au}/p$ and $h_{ox}/h_{au}$ to produce an approximately spurious-free response for the duty factors 40%, 45%, 50%, 55%, and 60% according to one embodiment. FIG. 38 summarizes the data of FIGS. 32-36 by depicting an example graph of the comparison of $p/p_{ref}$ and $h_{ox}/h_{au}$ to produce an approximately spurious-free response for the duty factors 40%, 45%, 50%, 55%, and 60% according to one embodiment. It may be seen in FIG. 38 that the duty factors that produce an approximately spurious-free response may be close to linear for a given electrode period.

Figure 39:
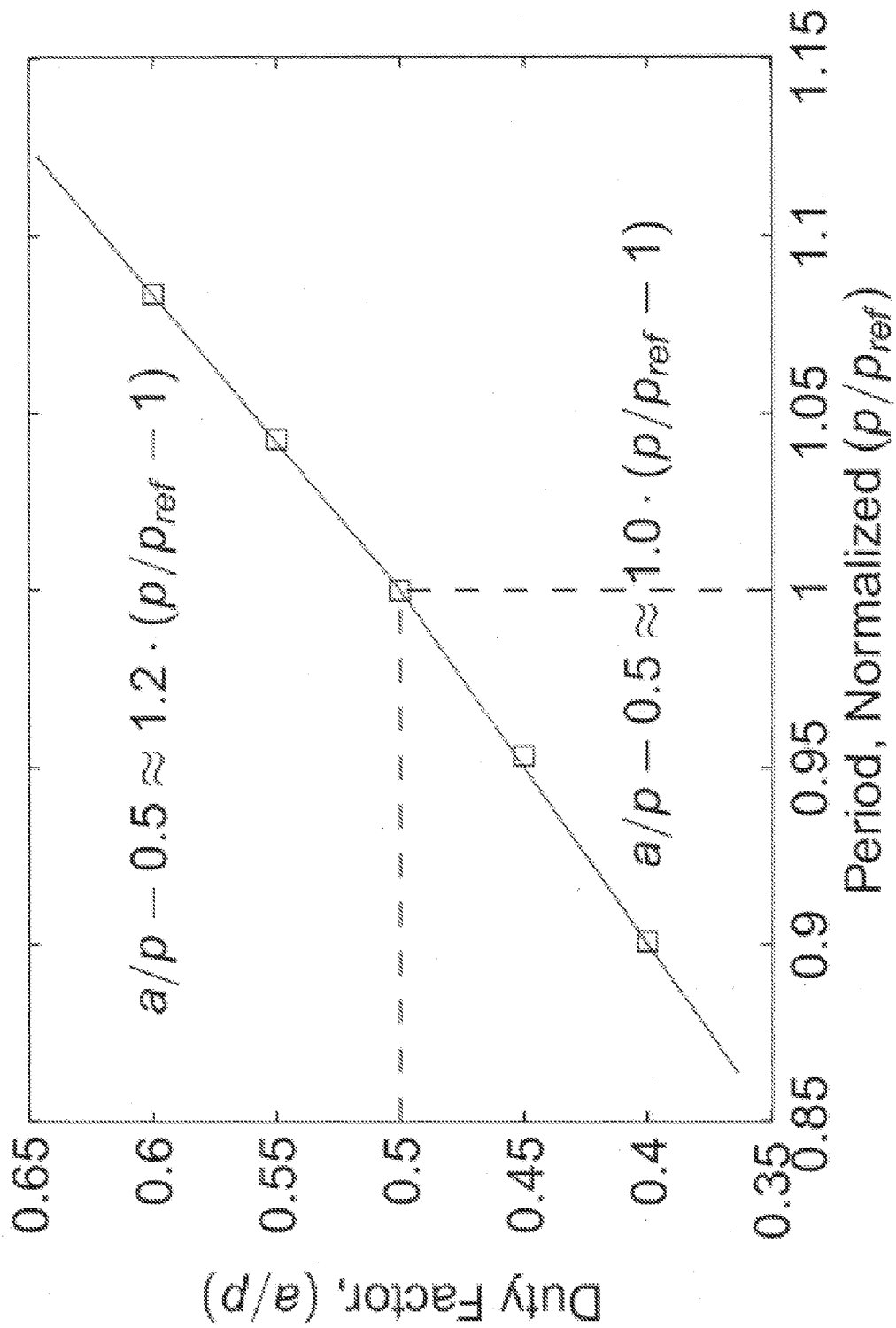
FIG. 39 is a graph displaying an example of a relationship of duty factors and period of electrodes in a resonator using a gold electrode, in accordance with various embodiments.

By considering the approximately spurious-free response as a function of duty factor, ranges may be developed depicting the nominal dependence of duty factor on period for an approximately spurious-free response. Specifically, FIG. 39 depicts an example of the duty factor (a/p) for an embodiment of a gold electrode as a function of normalized period ($p/p_{ref}$). As shown in FIG. 39, the duty factor may be approximated in some embodiments as a/p may be approximately equal to $0.5+1.0*(p/p_{ref}-1)$. In other embodiments, the duty factor may be approximated in some embodiments as a/p may be approximately equal to $0.5+1.2*(p/p_{ref}-1)$.

In additional embodiments, an example of a reference resonant frequency, $f_{R,ref}$, may be introduced. This reference resonant frequency may be the resonant frequency of a reference resonator on a PBAW device, which in some embodiments may be a nominal resonator on the PBAW device. In embodiments, the normalized frequency $f_R/f_{R,ref}$ may be shown to have an inverse relationship with the normalized period $p/p_{ref}$ of a resonator using a gold electrode to produce an approximately spurious-free response in some embodiments, as shown in FIG. 40.

Figure 40:
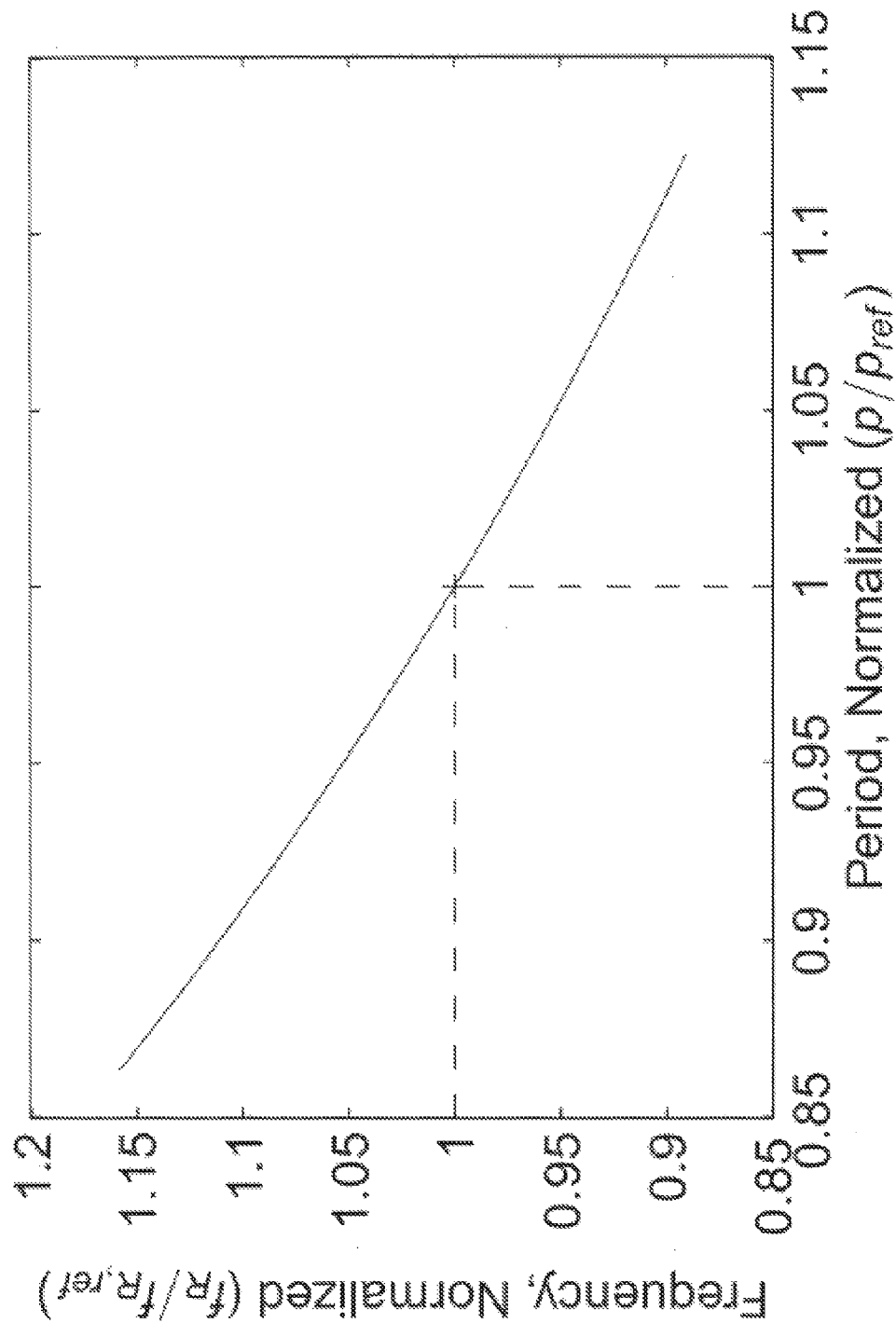
FIG. 40 is a graph displaying an example of an estimate of a spurious free range of resonant frequencies for a resonator using a gold electrode, in accordance with various embodiments.

As may be seen above with respect to FIGS. 39 and 40, modulation of the duty factor may result in an approximately spurious-free response for a resonator using a gold electrode over a fractional bandwidth of 25%. Specifically, a/p may approximate $0.5+1.0*(p/p_{ref}-1)$ for $p<p_{ref}$. Additionally, a/p may approximate $0.5+1.2*(p/p_{ref}-1)$ for $p>p_{ref}$. For narrow ranges, a simpler approximation for the modulation of the duty factor may be used. Specifically, a–p may approximate $a_{ref}-p_{ref}$. These approximations may imply that the resonators of a PBAW device, for example resonators 14 and 16 of PBAW device 10, may each have approximately equal spaces (p–a) between their electrodes.

Figure 41:
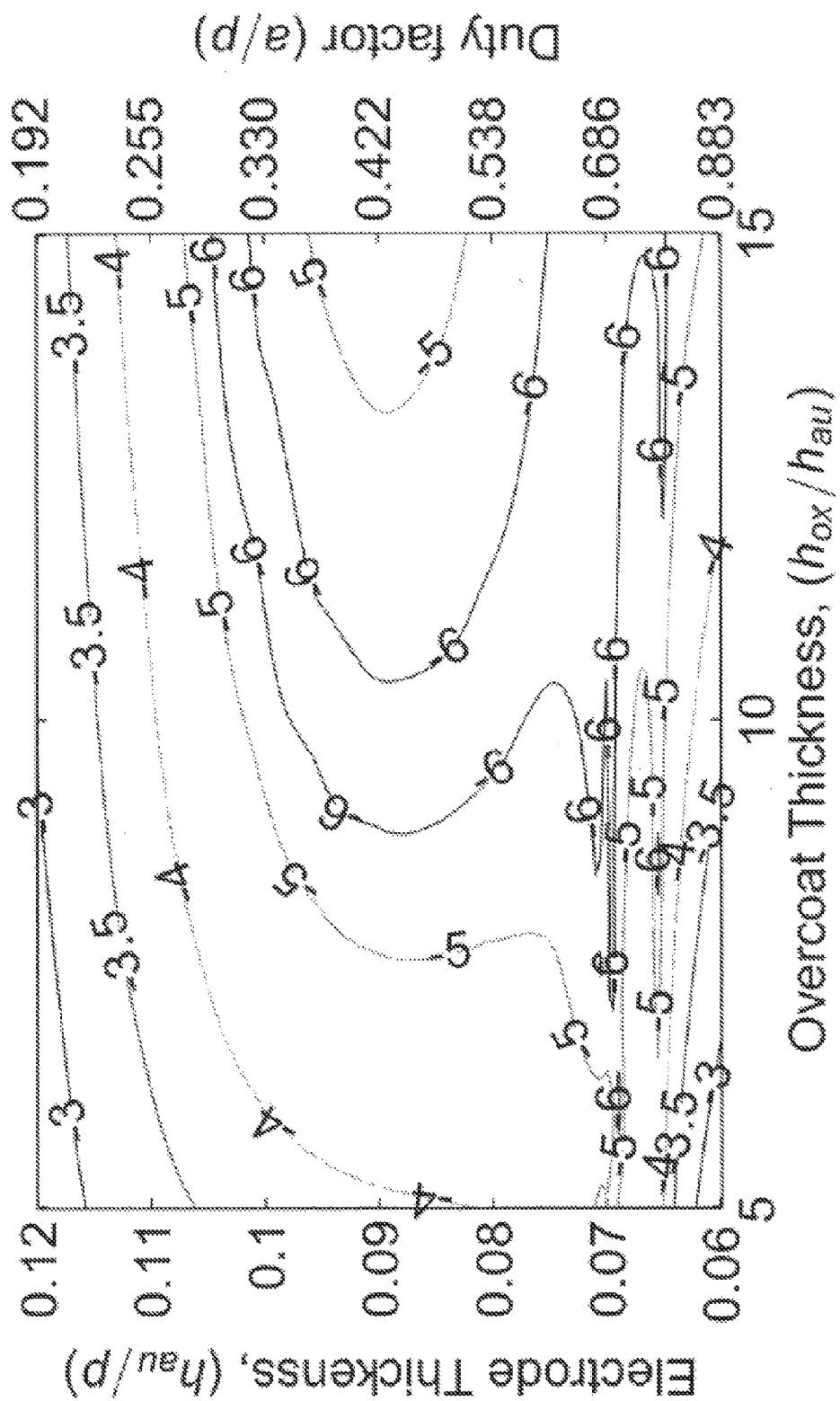
FIG. 41 is a graph displaying example spurious mode coupling coefficients of a resonator using a gold electrode, in accordance with various embodiments.

In embodiments, these duty factors may be used to produce PBAW devices such as PBAW device 10 with an approximately spurious-free response for a gold electrode. For example, in one embodiment, $h_{au}/p_{ref}$ may be equal to 0.083. FIG. 41 depicts an example of the spurious mode coupling coefficients of a gold electrode in an embodiment where $h_{au}/p_{ref}$ may be equal to 0.083, and a/p approximates $0.5+(p/p_{ref}-1)$, as discussed above with respect to FIG. 39. The spurious mode coupling coefficients may be interpreted on a $\log_{10}$ scale as described above with respect to FIG. 8. In FIG. 41, the spurious mode coupling coefficients are shown as a function of $h_{au}/p$, $h_{ox}/h_{au}$, and the duty factor (a/p) of the electrode. It may be seen in FIG. 1 that a substantial portion of FIG. 41 displays an approximately spurious-free response by having spurious-mode coupling coefficients on the order of $\log_{10}(K^2_{spur})$ being approximately $\leq -4$.

Figure 42:
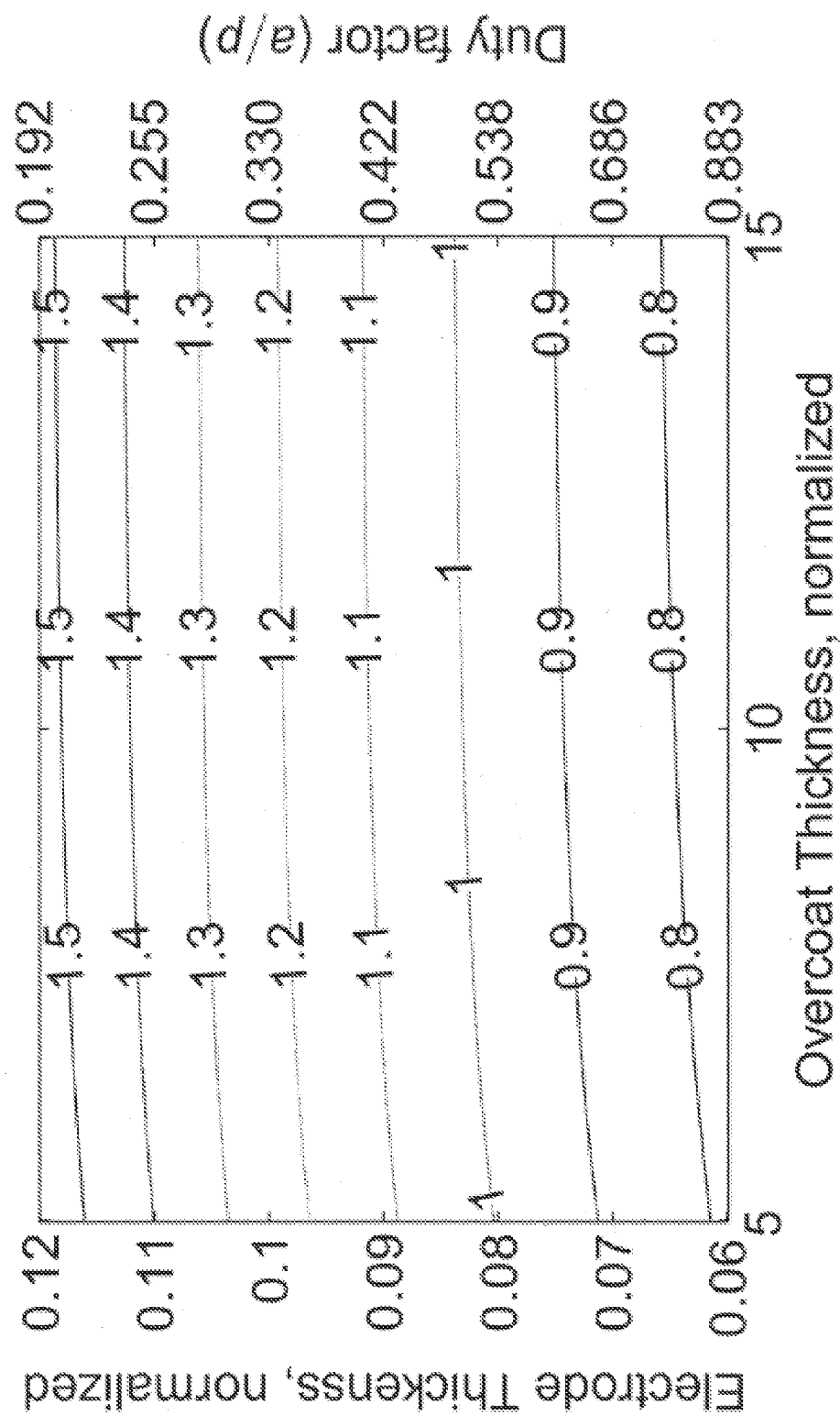
FIG. 42 is a graph displaying example frequency coefficients of a resonator using a gold electrode, in accordance with various embodiments.
Figure 43:
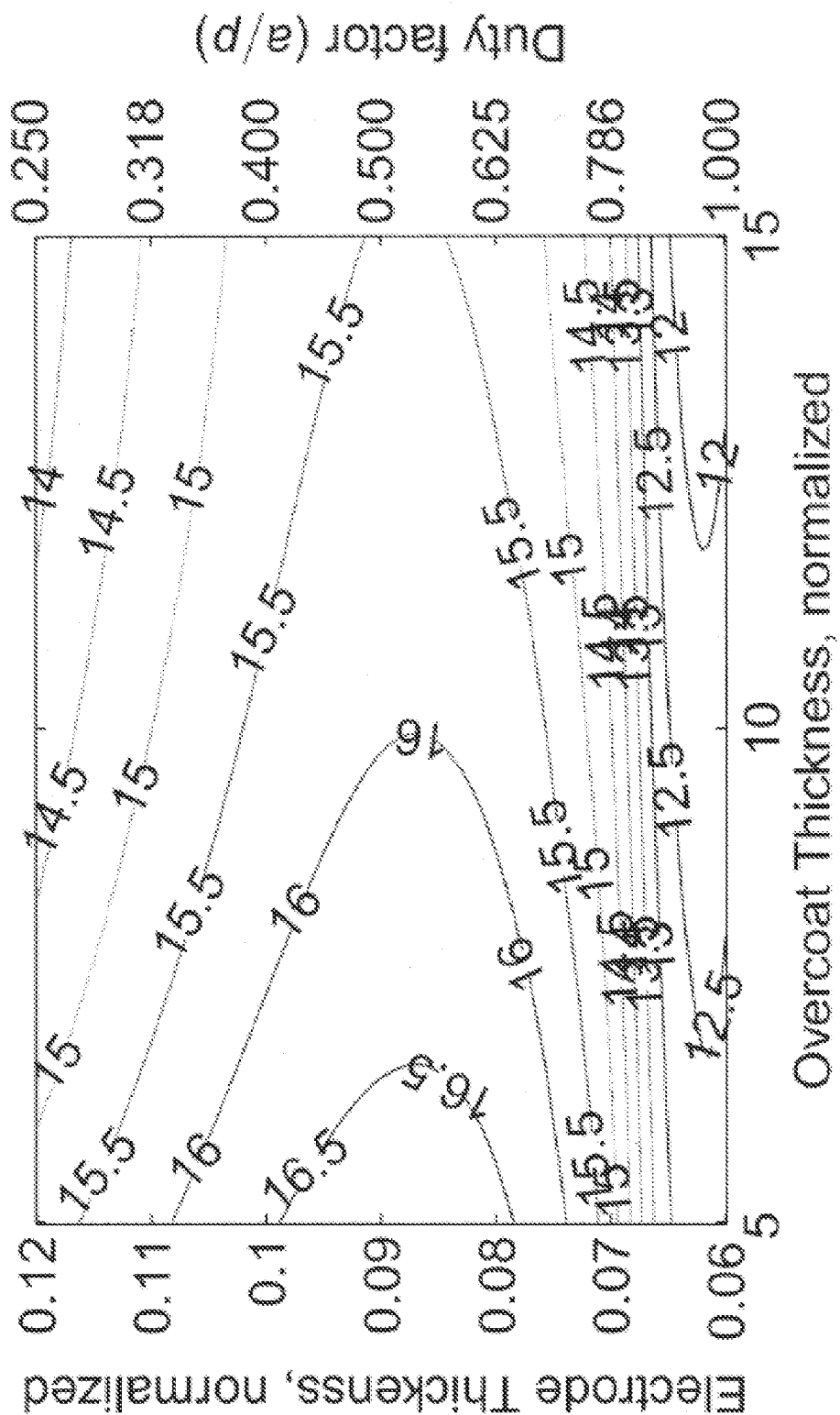
FIG. 43 is a graph displaying coupling coefficients of a resonator using a gold electrode, in accordance with various embodiments.

FIG. 42 depicts an example of normalized frequency coefficients of a resonator using a gold electrode in the embodiment where $h_{au}/p_{ref}$ may be equal to 0.083, and a/p approximates $0.5+(p/p_{ref}-1)$, as discussed above with respect to FIG. 39. FIG. 43 depicts an example of coupling coefficients of the resonator using the gold electrode in the embodiment where $h_{au}/p_{ref}$ may be equal to 0.083, and a/p approximates $0.5+(p/p_{ref}-1)$, as discussed above with respect to FIG. 39. In FIG. 43, the coupling coefficients may be interpreted similarly to the coupling coefficients discussed above with respect to FIG. 7. Similarly to FIG. 41, FIGS. 42 and 43 are displayed as a function of $h_{au}/p$, $h_{ox}/h_{au}$, and the duty factor (a/p) of the resonator. It may be seen with reference to FIGS. 41-43 that the use of an $h_{au}/p_{ref}$ of approximately 0.083 may produce suppression of the spurious mode over a substantially broad range of periods, on the order of greater than 30%, where the filter using $h_{au}/p_{ref}$ of approximately 0.083 may show little or no spurious mode response.

Figure 44:
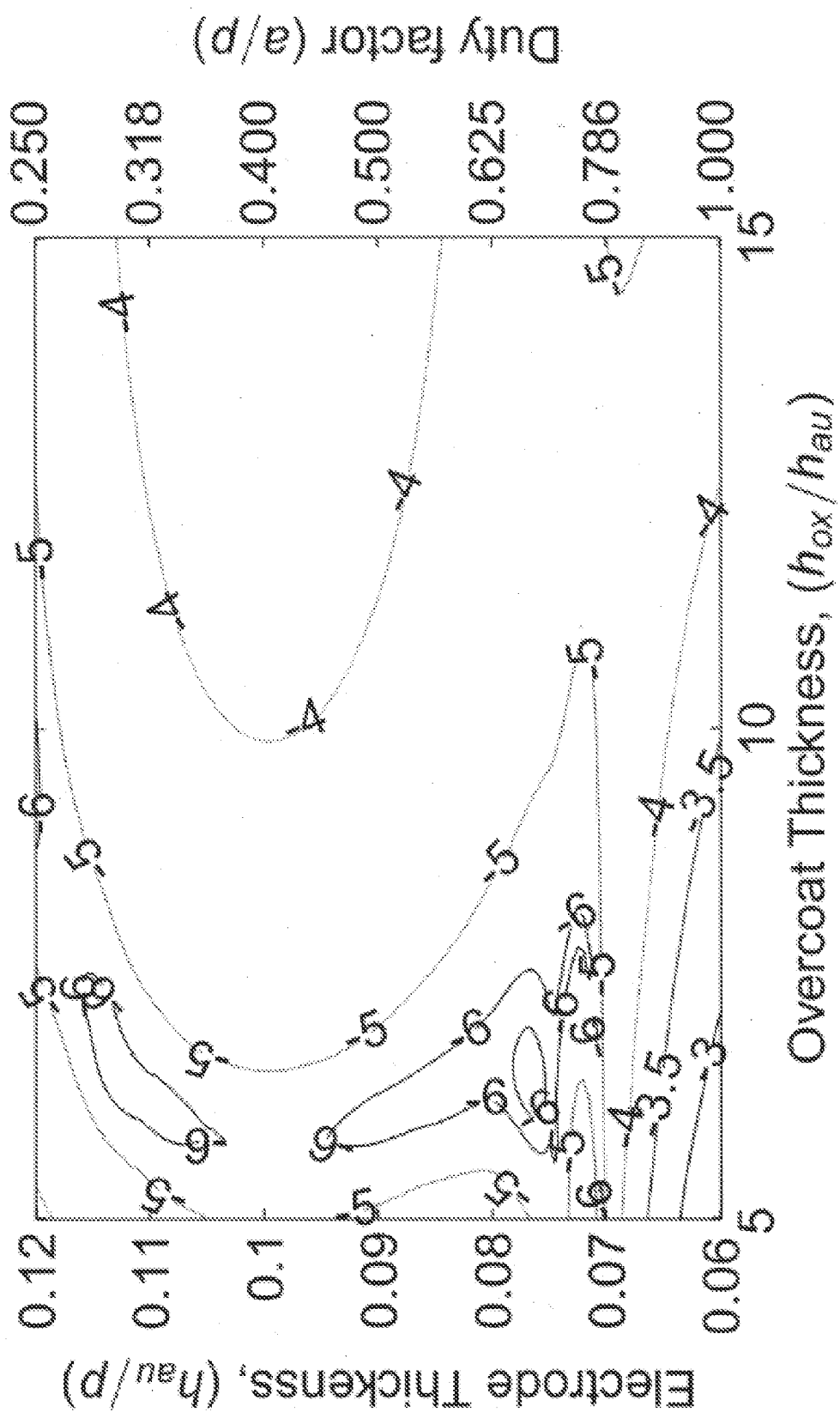
FIG. 44 is a graph displaying example spurious mode coupling coefficients of a resonator using a gold electrode, in accordance with various embodiments.
Figure 45:
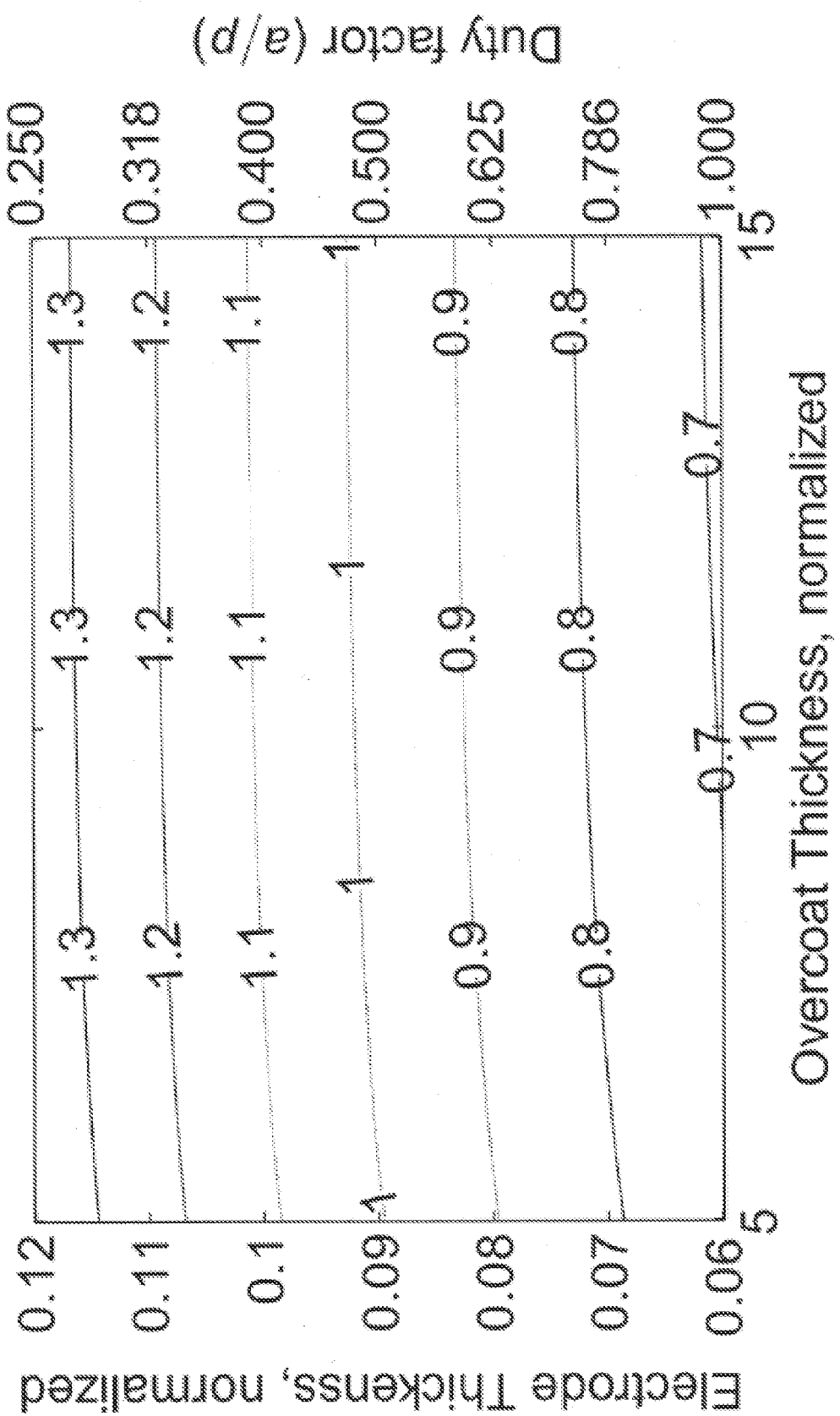
FIG. 45 is a graph displaying example frequency coefficients of a resonator using a gold electrode, in accordance with various embodiments.
Figure 46:
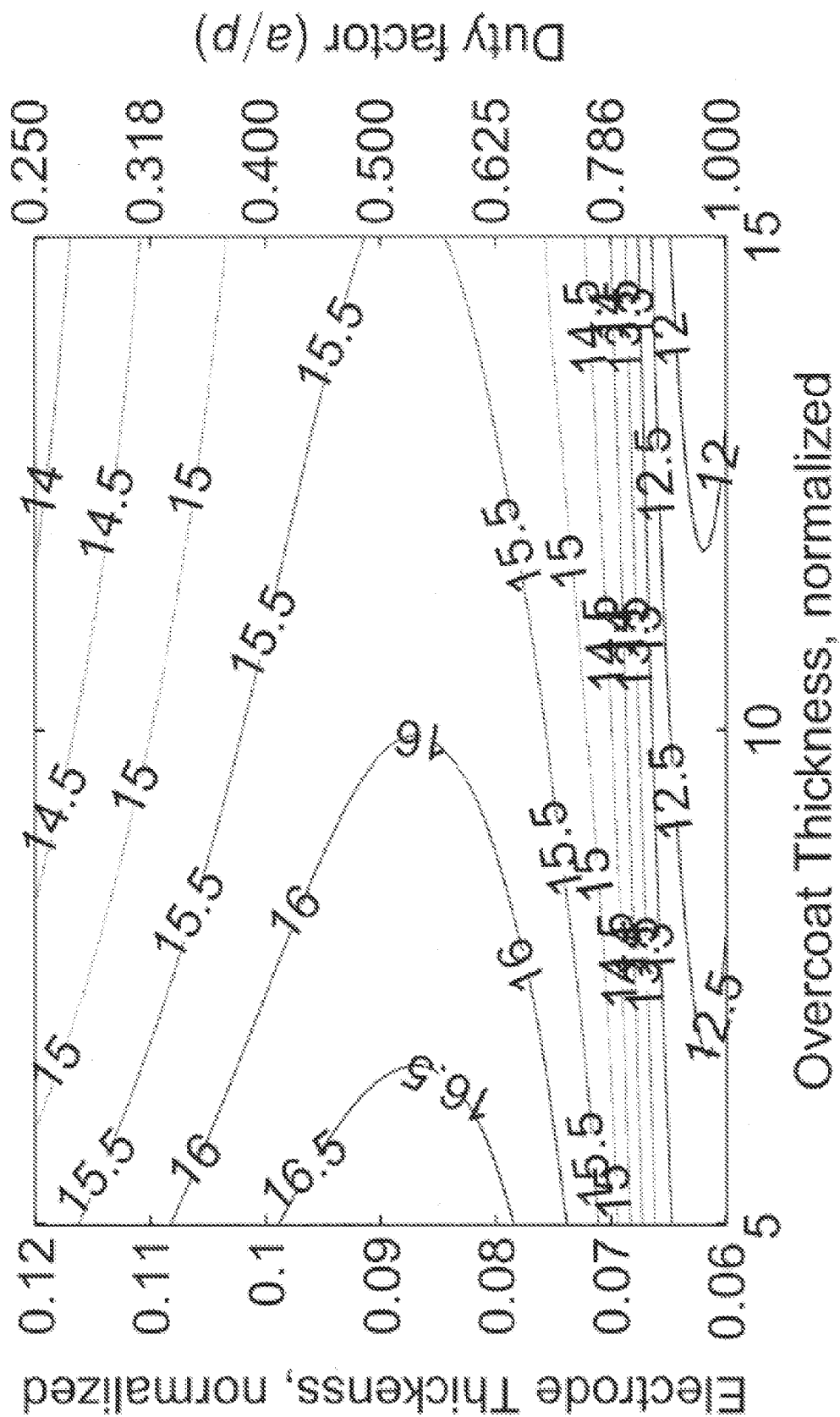
FIG. 46 is a graph displaying example coupling coefficients of a resonator using a gold electrode, in accordance with various embodiments.

By contrast, FIGS. 44-46 are similar to FIGS. 41-43, respectively, with the primary difference between the FIGS. being that FIGS. 44-46 depict embodiments where $h_{au}/p_{ref}$ may approximate 0.09. Contrast of FIGS. 41-43 to FIGS. 44-46 indicates that an increase in the relative metal thickness of the reference resonator may result in an approximately spurious free response for thinner overcoat thicknesses. In other words, the relative metal thickness of the reference resonator may be inversely proportional to overcoat thickness.

It will be noted that for several of the embodiments described above, the embodiments were described with respect to a resonator using a gold electrode. However, in other embodiments the electrode may additionally or alternatively include copper, tungsten, and/or some other appropriate material. In general, the equations and values described above and in the various FIGS. may be appropriately revised to account for the material differences of the different materials.

Through review of the embodiments above, it may be seen that an electrode's thickness in a resonator of a PBAW device, for example electrodes 30 or 30A in PBAW device 10, may be bracketed using the empirical relation depending on the electrode density and modulus, as described above with respect to FIG. 15. Specifically, $h_m$ may be between approximately $$\frac{\sqrt[4]{\left(\frac{c_m}{c_{ox}}\right)}}{\left(\frac{\Delta_m}{\Delta_{ox}}-1\right)} \text{ and } \frac{\sqrt[4]{\left(\frac{c_m}{c_{ox}}\right)}}{2*\left(\frac{\Delta_m}{\Delta_{ox}}-1\right)}.$$

Additionally, as described above with respect to FIG. 30, y-rotations of the YX-LN substrate such as substrate 12 of the PBAW device 10 may suffer passband distortion due to BAW radiation occurring in the passband.

In embodiments, it may be desirable for the y-rotation of the YX-LN substrate to be between approximately 18° and 24°. In some embodiments, the PBAW device's resonant frequency may be proportional to the y-rotation of the substrate to maintain an approximately spurious-free response, such that the PBAW device's resonant frequency increases with increasing y-rotation.

In some embodiments, as described above with respect to FIG. 39 and elsewhere herein to a gold electrode, a desirable duty factor a/p of general electrode in a resonator may be approximately $0.5+(p/p_{ref}-1)$. In some embodiments, the desirable duty factor a/p may be extrapolated to be between approximately $0.5+0.5*(p/p_{ref}-1)$ and approximately $0.5+1.5*(p/p_{ref}-1)$. As indicated by the above described range, the duty factor of an electrode such as electrodes 30 or 30A of PBAW device 10 may increase with an increase of the electrode period 28 or 28A. In some embodiments, an exception may be made for resonators with a spurious mode response that would not coincide with the passband of the PBAW device.

Figure 47:
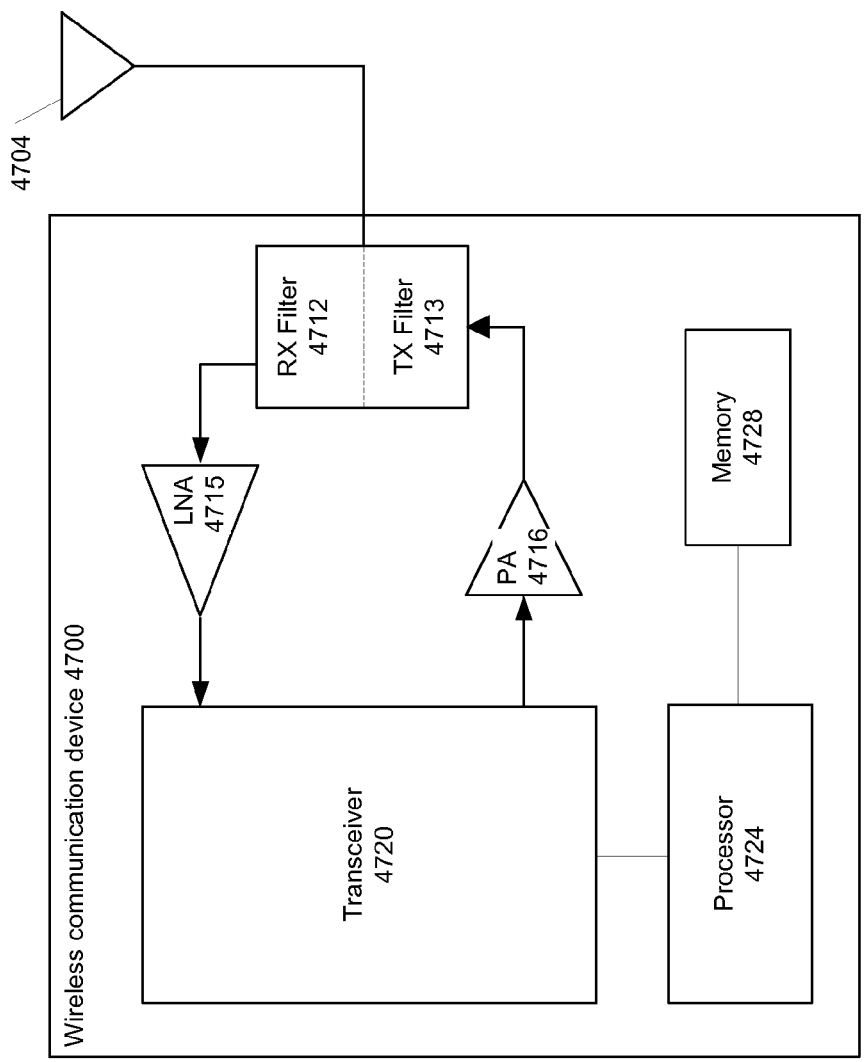
FIG. 47 is a block diagram of an example of a wireless communication device, in accordance with various embodiments.

A wireless communication device 4700 is illustrated in FIG. 47 in accordance with some embodiments. The wireless communication device 4700 may have an antenna structure 4704, a duplexer 4708 (containing an RX filter 4712 and a TX filter 4713), a power amplifier (PA) 4716, a low noise amplifier (LNA) 4715, a transceiver 4720, a processor 4724, and a memory 4728 coupled with each other at least as shown.

The antenna structure 4704 may include one or more antennas to transmit and receive radio frequency (RF) signals over the air. The antenna structure 4704 may be coupled with the duplexer 4708 that operates to selectively couple the antenna structure with the LNA 4715 or the PA 4716. When transmitting outgoing RF signals, the duplexer's 4708 TX filter 4713 may couple the antenna structure 4704 with the PA 4716. When receiving incoming RF signals, the duplexer's 4708 RX filter 4712 may couple the antenna structure 4704 with the LNA 4715. The RX and TX filters 4712 and 4713 may include one or more PBAW devices, such as PBAW devices 10 or 4900. In some embodiments, the RX and TX filters 4712 and 4713 may include a first plurality of series resonators and a second plurality resonators. The RX filter 4712 may filter the RF signals received from the antennae 4704 and pass portions of the RF signals within a predetermined bandpass to the transceiver 4720.

When transmitting outgoing RF signals, the duplexer 4708 may couple the antenna structure 4704 with the PA 4716. The PA 4716 may receive RF signals from the transceiver 4720, amplify the RF signals, and provide the RF signals to the antenna structure 4708 for over-the-air transmission.

The processor 4724 may execute a basic operating system program, stored in the memory 4728, in order to control the overall operation of the wireless communication device 4700. For example, the main processor 4724 may control the reception of signals and the transmission of signals by transceiver 4720. The main processor 4724 may be capable of executing other processes and programs resident in the memory 4728 and may move data into or out of memory 4728, as desired by an executing process.

The transceiver 4720 may receive outgoing data (e.g., voice data, web data, e-mail, signaling data, etc.) from the processor 4724, may generate RF signals to represent the outgoing data, and provide the RF signals to the PA 4716. Conversely, the transceiver 4720 may receive RF signals from the filter 4712 that represent incoming data. The transceiver 4720 may process the RF signals and send incoming signals to the processor 4724 for further processing.

In various embodiments, the wireless communication device 4700 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 4700 is given by way of example and that, for simplicity and clarity, only so much of the construction and operation of the wireless communication device 4700 as is necessary for an understanding of the embodiments is shown and described. Various embodiments contemplate any suitable component or combination of components performing any suitable tasks in association with wireless communication device 4700, according to particular needs. Moreover, it is understood that the wireless communication device 4700 should not be construed to limit the types of devices in which embodiments may be implemented.

In embodiments, a PBAW may include a substrate; a resonator coupled with a surface of the substrate, the resonator including a plurality of electrodes having a period, and an electrode in the plurality of electrodes having a width based at least in part on a period of the electrode; a dielectric overcoat coupled with the substrate and the resonator, the dielectric overcoat disposed over the substrate and the resonator, the dielectric overcoat having a shear wave velocity; and an additional material coupled with a surface of the dielectric overcoat, the additional material having a shear wave velocity that is greater than the shear wave velocity of the dielectric overcoat. In embodiments, a ratio of the width to the period may be equal to $0.5*(p/p_{ref}-1) \le a/p - 0.5 \le 1.5*(p/p_{ref}-1)$ where p is the period, a is the width, and $p_{ref}$ is a reference period of the PBAW device. In embodiments, the ratio of the width to the period may be equal to $0.5+(p/p_{ref}-1)$. In embodiments, the substrate may include lithium niobate (LiNbO$_3$). In embodiments, the dielectric overcoat may include silicon oxide (SiOx). In embodiments, the resonator may have an electromechanical coupling factor of approximately 16 percent. In embodiments, the substrate may have a Y-rotation of between 18 and 24 degrees. In embodiments, electrodes in the plurality of electrodes may have a height based at least in part on a density measurement of a material of the electrodes and a shear modulus of the material of the electrodes. In embodiments, the height of the electrodes may be equal to $$\frac{\sqrt[4]{\left(\frac{c_m}{c_{ox}}\right)}}{\left(\frac{\Delta_m}{\Delta_{ox}}-1\right)} > h_m > 0.5 * \frac{\sqrt[4]{\left(\frac{c_m}{c_{ox}}\right)}}{\left(\frac{\Delta_m}{\Delta_{ox}}-1\right)}$$

where $h_m$ is the height of the electrodes, $c_m$ is a shear modulus of the electrodes, $c_{ox}$ is a shear modulus of the dielectric overcoat, $\Delta_m$ is a density of the electrodes, and $\Delta_{ox}$ is a density of the dielectric overcoat. In embodiments, the electrodes may include gold (Au), copper (Cu), or tungsten (W).

In embodiments, a process may include depositing, on a substrate of a piezoelectric boundary acoustic wave (PBAW) device, a resonator including a plurality of electrodes, each electrode in the plurality of electrodes having a respective width based at least in part on a respective period of the plurality of electrodes; depositing a dielectric overcoat on the plurality of electrodes and the substrate, the dielectric overcoat having a shear wave velocity; and depositing an additional material on the dielectric overcoat, the additional material having a shear wave velocity that is greater than the shear wave velocity of the dielectric overcoat. In embodiments, a ratio of a width of an electrode in the plurality of electrodes to the period may be equal to $0.5*(p/p_{ref}-1) \leq a/p-0.5 \leq 1.5*(p/p_{ref}-1)$ where p is the period, a is the width, and $p_{ref}$ is a reference period of the PBAW device. In embodiments, the ratio of the width of the electrode to the period of the electrode may be equal to $0.5+(p/p_{ref}-1)$. In embodiments, the substrate may include lithium niobate ($LiNbO_3$). In embodiments, the dielectric overcoat may include silicon oxide (SiOx). In embodiments, the resonator may have an electromechanical coupling factor of approximately 16 percent. In embodiments, the substrate may have a Y-rotation of between 18 and 24 degrees. In embodiments, an electrode in the plurality of electrodes may have a height based at least in part on a density measurement of a material of the electrode and a shear modulus of the material of the electrode. In embodiments, the height of the electrode may be equal to $$\frac{\sqrt[4]{\left(\frac{c_m}{c_{ox}}\right)}}{\left(\frac{\Delta_m}{\Delta_{ox}}-1\right)} > h_m > 0.5 * \frac{\sqrt[4]{\left(\frac{c_m}{c_{ox}}\right)}}{\left(\frac{\Delta_m}{\Delta_{ox}}-1\right)}$$

where $h_m$ is the height of the electrode, $c_m$ is a shear modulus of the electrode, $c_{ox}$ is a shear modulus of the dielectric overcoat, $d_m$ is a density of the electrode, and $d_m$ is a density of the dielectric overcoat. In embodiments, an electrode in the plurality of electrodes may include gold (Au), copper (Cu), or tungsten (W).

In embodiments, a system may include a power supply and a piezoelectric boundary acoustic wave (PBAW) device coupled to the power supply. The PBAW device may include a substrate; a first resonator coupled with a surface of the substrate, the first resonator including a first electrode having a period and a width based at least in part on the period; a second resonator coupled with the surface of the substrate, the second resonator including a second electrode having a period and a width based at least in part on the period, the width of the second electrode being different from the width of the first electrode, and the period of the second electrode being different from the period of the first electrode; a dielectric overcoat disposed over the substrate, the first electrode, and the second electrode, the dielectric overcoat having a shear wave velocity; and an additional material disposed over the dielectric overcoat, the additional material having a shear wave velocity greater than the shear wave velocity of the dielectric overcoat. In embodiments, a ratio of the width of the first electrode to the period of the first electrode may be equal to $0.5*(p/p_{ref}-1) \leq a/p-0.5 \leq 1.5*(p/p_{ref}-1)$ where p is the period, a is the width, and $p_{ref}$ is a reference period. In embodiments, the first resonator may have an electromechanical coupling factor of approximately 16 percent. In embodiments, the substrate may have a Y-rotation of between 18 and 24 degrees. In embodiments, the first electrode may have a height equal to $$\frac{\sqrt[4]{\left(\frac{c_m}{c_{ox}}\right)}}{\left(\frac{\Delta_m}{\Delta_{ox}}-1\right)} > h_m > 0.5 * \frac{\sqrt[4]{\left(\frac{c_m}{c_{ox}}\right)}}{\left(\frac{\Delta_m}{\Delta_{ox}}-1\right)}$$

where $h_m$ is the height of the first electrode, $c_m$ is a shear modulus of the first electrode, $c_{ox}$ is a shear modulus of the dielectric overcoat, $\Delta_m$ is a density of the first electrode, and $\Delta_{ox}$ is a density of the dielectric overcoat. In embodiments, the first electrode may include gold (Au), copper (Cu), or tungsten (W).

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A piezoelectric boundary acoustic wave (PBAW) device comprising:
   a substrate;
   a resonator coupled with a surface of the substrate, the resonator comprising a plurality of electrodes having a period and an electrode in the plurality of electrodes having a width based at least in part on a period of the electrode where electrodes in the plurality of electrodes have a height based at least in part on a density measurement of a material of the electrodes and a shear modulus of the material of the electrodes, wherein the height of the electrodes is equal to $$\frac{\sqrt[4]{\left(\frac{c_m}{c_{ox}}\right)}}{\left(\frac{\Delta_m}{\Delta_{ox}}-1\right)} > h_m > 0.5 * \frac{\sqrt[4]{\left(\frac{c_m}{c_{ox}}\right)}}{\left(\frac{\Delta_m}{\Delta_{ox}}-1\right)}$$

where $h_m$ is the height of the electrodes, $c_m$ is a shear modulus of the electrodes, $c_{ox}$ is a shear modulus of the dielectric overcoat, $\Delta_m$ is a density of the electrodes, and $\Delta_{ox}$ is a density of the dielectric overcoat;
   a dielectric overcoat coupled with the substrate and the resonator, the dielectric overcoat disposed over the substrate and the resonator, the dielectric overcoat having a shear wave velocity; and
   an additional material coupled with a surface of the dielectric overcoat, the additional material having a shear wave velocity that is greater than the shear wave velocity of the dielectric overcoat.

2. The PBAW device of claim 1, wherein a ratio of the width to the period is equal to $0.5*(p/p_{ref}-1) \leq a/p-0.5 \leq 1.5*(p/p_{ref}-1)$ where p is the period, a is the width, and $p_{ref}$ is a reference period of the PBAW device.

3. The PBAW device of claim 2, wherein the ratio of the width to the period is equal to $0.5+(p/p_{ref}-1)$.

4. The PBAW device of claim 1, wherein the substrate comprises lithium niobate ($LiNbO_3$).

5. The PBAW device of claim 1, wherein the dielectric overcoat comprises silicon oxide (SiOx).

6. The PBAW device of claim 1, wherein the resonator has an electromechanical coupling factor of approximately 16 percent.

7. The PBAW device of claim 1, wherein the substrate has a Y-rotation of between 18 and 24 degrees.

8. The PBAW device of claim 1, wherein the electrodes comprise gold (Au), copper (Cu), or tungsten (W).

9. A method comprising:
depositing, on a substrate of a piezoelectric boundary acoustic wave (PBAW) device, a resonator comprising a plurality of electrodes, each electrode in the plurality of electrodes having a respective width based at least in part on a respective period of the plurality of electrodes where electrodes in the plurality of electrodes have a height based at least in part on a density measurement of a material of the electrodes and a shear modulus of the material of the electrodes, wherein the height of the electrodes is equal to $$\frac{\sqrt[4]{\left(\frac{c_m}{c_{ox}}\right)}}{\left(\frac{\Delta_m}{\Delta_{ox}}-1\right)} > h_m > 0.5 * \frac{\sqrt[4]{\left(\frac{c_m}{c_{ox}}\right)}}{\left(\frac{\Delta_m}{\Delta_{ox}}-1\right)}$$

where $h_m$ is the height of the electrodes, $c_m$ is a shear modulus of the electrodes, $c_{ox}$ is a shear modulus of the dielectric overcoat, $\Delta_m$ is a density of the electrodes, and $\Delta_{ox}$ is a density of the dielectric overcoat;
depositing a dielectric overcoat on the plurality of electrodes and the substrate, the dielectric overcoat having a shear wave velocity; and
depositing an additional material on the dielectric overcoat, the additional material having a shear wave velocity that is greater than the shear wave velocity of the dielectric overcoat.

10. The method of claim 9, wherein a ratio of a width of an electrode in the plurality of electrodes to the period is equal to $0.5*(p/p_{ref}-1) \leq a/p-0.5 \leq 1.5*(p/p_{ref}-1)$ where p is the period, a is the width, and $p_{ref}$ is a reference period of the PBAW device.

11. The method of claim 10, wherein the ratio of the width of the electrode to the period of the electrode is equal to $0.5+(p/p_{ref}-1)$.

12. The method of claim 9, wherein the substrate comprises lithium niobate ($LiNbO_3$).

13. The method of claim 9, wherein the dielectric overcoat comprises silicon oxide (SiOx).

14. The method of claim 9, wherein the resonator has an electromechanical coupling factor of approximately 16 percent.

15. The method of claim 9, wherein the substrate has a Y-rotation of between 18 and 24 degrees.

16. The method of claim 9, wherein an electrode in the plurality of electrodes comprises gold (Au), copper (Cu), or tungsten (W).

17. A system comprising:
a power supply;
a piezoelectric boundary acoustic wave (PBAW) device coupled to the power supply, the PBAW device comprising:
a substrate;
a first resonator coupled with a surface of the substrate, the first resonator comprising a first electrode having a period and a width based at least in part on the period, wherein the first electrode has a height equal to $$\frac{\sqrt[4]{\left(\frac{c_m}{c_{ox}}\right)}}{\left(\frac{\Delta_m}{\Delta_{ox}}-1\right)} > h_m > 0.5 * \frac{\sqrt[4]{\left(\frac{c_m}{c_{ox}}\right)}}{\left(\frac{\Delta_m}{\Delta_{ox}}-1\right)}$$

where $h_m$ is the height of the first electrode, $c_m$ is a shear modulus of the first electrode, $c_{ox}$ is a shear modulus of the dielectric overcoat, $\Delta_m$ is a density of the first electrode, and $\Delta_{ox}$ is a density of the dielectric overcoat;
a second resonator coupled with the surface of the substrate, the second resonator comprising a second electrode having a period and a width based at least in part on the period, the width of the second electrode being different from the width of
the first electrode, and the period of the second electrode being different from the period of the first electrode;
a dielectric overcoat disposed over the substrate, the first electrode, and the second electrode, the dielectric overcoat having a shear wave velocity; and
an additional material disposed over the dielectric overcoat, the additional material having a shear wave velocity greater than the shear wave velocity of the dielectric overcoat.

18. The system of claim 17, wherein a ratio of the width of the first electrode to the period of the first electrode is equal to $0.5*(p/p_{ref}-1) \leq a/p-0.5 \leq 1.5*(p/p_{ref}-1)$ where p is the, a is the width, and $p_{ref}$ is a reference period.

19. The system of claim 17, wherein the first resonator has an electromechanical coupling factor of approximately 16 percent.

20. The system of claim 17, wherein the substrate has a Y-rotation of between 18 and 24 degrees.

21. The system of claim 17, wherein the first electrode comprises gold (Au), copper (Cu), or tungsten (W).

* * * * *

UNITED STATES PATENT AND TRADEMARK OFFICE
CERTIFICATE OF CORRECTION

PATENT NO.         : 9,236,849 B2                                              Page 1 of 1
APPLICATION NO.    : 13/801145
DATED              : January 12, 2016
INVENTOR(S)        : Abbott et al.

It is certified that error appears in the above-identified patent and that said Letters Patent is hereby corrected as shown below:

In the Specification:

In column 6, line 26, replace "$h_{ox}$" with --$h_{ox}$ 26--.

In column 17, line 37, replace "coat, $d_m$ is a density of the electrode" with --coat, $\Delta_m$ is a density of the electrode--.

In column 17, lines 37 and 38, replace "and $d_m$ is a density of the dielectric" with --and $\Delta_{ox}$ is a density of the dielectric--.

Signed and Sealed this
Twelfth Day of July, 2016

Michelle K. Lee
*Director of the United States Patent and Trademark Office*